United States Patent
Ding et al.

(10) Patent No.: US 11,885,834 B2
(45) Date of Patent: Jan. 30, 2024

(54) MAGNETIC CURRENT SENSING

(71) Applicant: TEXAS INSTRUMENTS INCORPORATED, Dallas, TX (US)

(72) Inventors: Lei Ding, Plano, TX (US); Srinath Mathur Ramaswamy, Murphy, TX (US); Dok Won Lee, Mountain View, CA (US); Baher Haroun, Allen, TX (US); Wai Lee, Dallas, TX (US); Steven John Loveless, Sachse, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/463,112

(22) Filed: Aug. 31, 2021

(65) Prior Publication Data
US 2022/0065900 A1 Mar. 3, 2022

Related U.S. Application Data

(60) Provisional application No. 63/074,252, filed on Sep. 3, 2020, provisional application No. 63/074,240, filed on Sep. 3, 2020.

(51) Int. Cl.
*G01R 15/20* (2006.01)
*G01R 19/10* (2006.01)

(52) U.S. Cl.
CPC ........... *G01R 15/202* (2013.01); *G01R 19/10* (2013.01)

(58) Field of Classification Search
CPC ............................. G01R 15/202; G01R 19/10
USPC ........................................................ 324/114
See application file for complete search history.

(56) References Cited

U.S. PATENT DOCUMENTS

| | | | | |
|---|---|---|---|---|
| 9,176,203 B2* | 11/2015 | Ivanov | .................... | G01R 15/20 |
| 10,573,364 B1* | 2/2020 | Sanjeevarao | ....... | G11C 11/1659 |
| 2005/0045359 A1* | 3/2005 | Doogue | ............... | G01R 15/207 |
| | | | | 174/536 |
| 2009/0121704 A1* | 5/2009 | Shibahara | ............ | G01R 15/202 |
| | | | | 324/117 R |
| 2015/0219692 A1* | 8/2015 | Krah | .................. | G01R 33/0029 |
| | | | | 324/117 H |
| 2018/0080970 A1* | 3/2018 | Kraus | .................. | G01R 22/068 |

(Continued)

FOREIGN PATENT DOCUMENTS

RU 133316 U1 10/2013

OTHER PUBLICATIONS

PCT International Search Report dated Nov. 3, 2021.

*Primary Examiner* — Tung X Nguyen
*Assistant Examiner* — Robert P Alejnikov, Jr.
(74) *Attorney, Agent, or Firm* — Frank D. Cimino

(57) ABSTRACT

In a described example, a circuit includes a sensor circuit including multiple magnetic field sensors having respective sensor outputs. The magnetic field sensors are configured to provide magnetic field sensor signals at the respective sensor outputs representative of a measure of current flow through a conductive structure. A combiner interface has combiner inputs and a combiner output. The combiner inputs are coupled to the respective sensor outputs. The combiner interface is configured to provide an aggregate sensor measurement at the combiner output responsive to the magnetic field sensor signals, in which the aggregate sensor measurement is decoupled from magnetic fields generated responsive to the current flow through the conductive structure.

28 Claims, 14 Drawing Sheets

(56) References Cited

U.S. PATENT DOCUMENTS

2019/0018046 A1* 1/2019 Shimizu .............. G01R 31/382
2019/0079117 A1* 3/2019 Hurwitz ............. G01R 19/2509
2019/0097412 A1* 3/2019 Li ........................ G01R 31/52
2019/0219630 A1* 7/2019 Parker ................. G01R 31/327

* cited by examiner

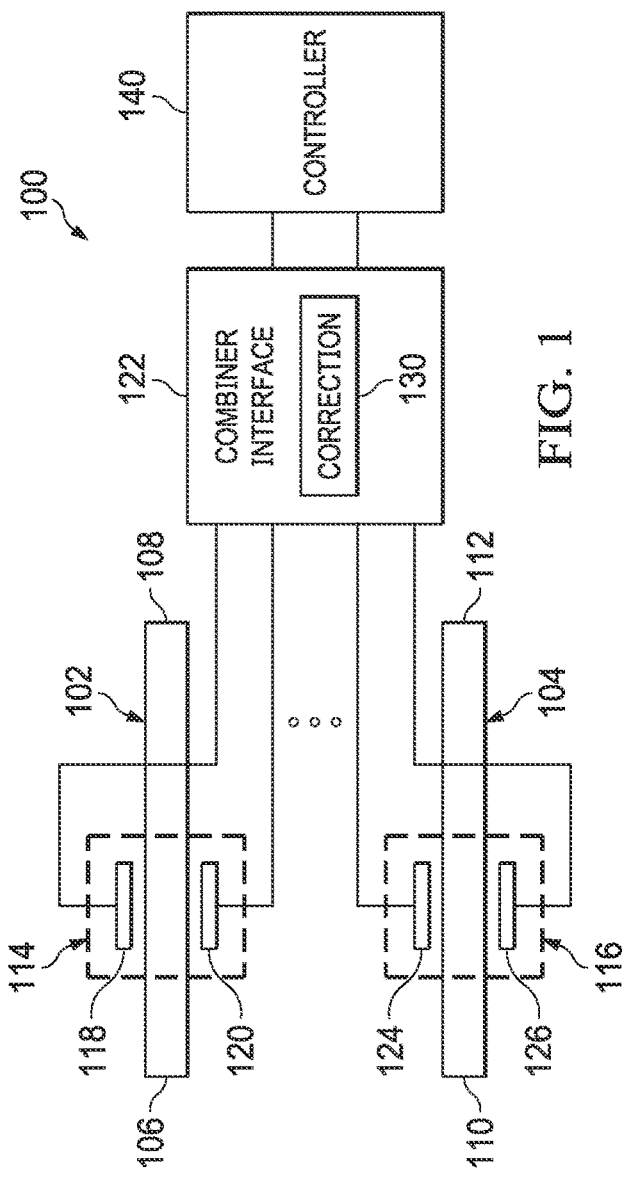
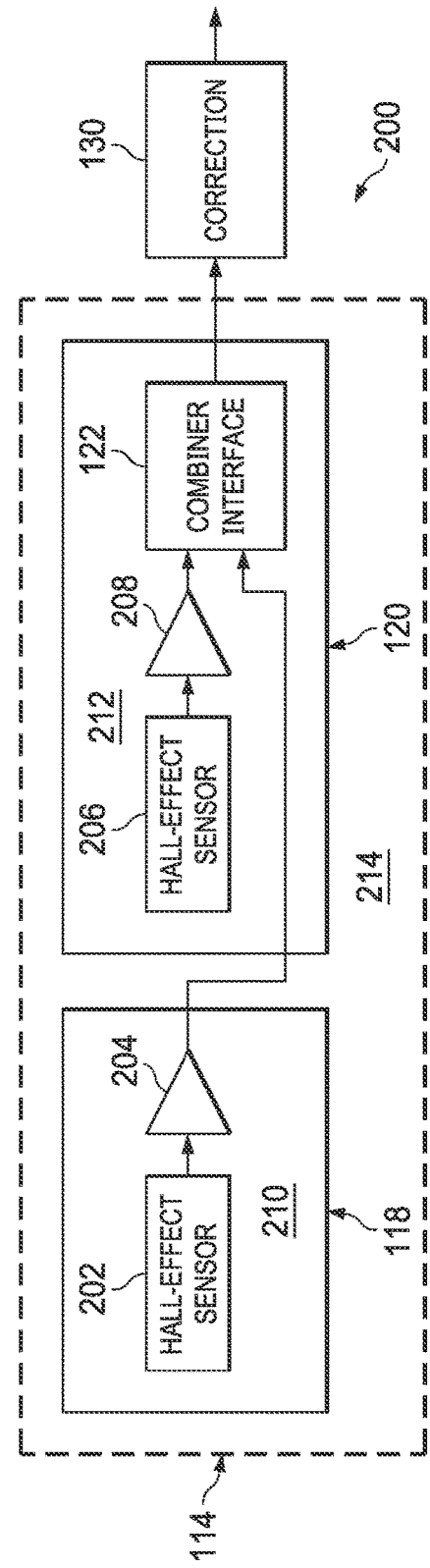
FIG. 1
FIG. 2

MAGNETIC CURRENT SENSING

CROSS-REFERENCE TO RELATED APPLICATIONS

This application claims priority to U.S. Provisional patent application No. 63/074,252, filed Sep. 3, 2020, and U.S. Provisional patent application No. 63/074,240, filed Sep. 3, 2020, each of which is incorporated herein by reference in its entirety.

TECHNICAL FIELD

This description relates to magnetic current sensing.

BACKGROUND

There are several different ways to sense current. For multi-phase systems, an example current sensing method is isolated phase-current measurement used to measure the magnetic field generated by a current through a conductive structure (e.g., a busbar). Some options available for such phase-current measurement include using use Hall-effect sensors, flux-gate sensors, current transformers, and shunt resistors. In an example of magnetic current sensing for isolated phase current measurement, a magnetic current sensor is placed around a busbar to measure magnetic fields. The measured magnetic fields can be converted to current measurements for further processing and control.

SUMMARY

In a described example, a circuit includes a sensor circuit including multiple magnetic field sensors having respective sensor outputs. The magnetic field sensors are configured to provide magnetic field sensor signals at the respective sensor outputs representative of a measure of current flow through a conductive structure. A combiner interface has combiner inputs and a combiner output. The combiner inputs are coupled to the respective sensor outputs. The combiner interface is configured to provide an aggregate sensor measurement at the combiner output responsive to the magnetic field sensor signals, in which the aggregate sensor measurement is decoupled from magnetic fields generated responsive to the current flow through the conductive structure.

In another described example, a circuit includes a first magnetic field sensor having a first sensor output. The first magnetic field sensor is configured to provide a first magnetic field sensor signal at the first sensor output representative of a measure of current flow through a first conductive structure. A second magnetic field sensor has a second sensor output. The second magnetic field sensor is configured to provide a second magnetic field sensor signal at the second sensor output representative of a measure of current flow through a second conductive structure. A combiner interface has combiner inputs and combiner output. The combiner inputs are coupled to the first and second sensor outputs. The combiner interface is configured to provide an aggregate sensor measurement at the combiner output responsive to the first and second magnetic field sensor signals, in which the aggregate sensor measurement is decoupled from magnetic fields generated responsive to current flow through the first and second conductive structures.

In a further described example, a system includes an arrangement of power switch devices having a voltage input and a multi-phase output. The power switches also have a control input. A gate driver has a driver input and driver outputs. The driver outputs are coupled to respective control inputs of the power switches. A multi-phase busbar includes conductive structures extending between respective first and second ends, in which the first ends are coupled to the multi-phase output of the power switches. An array of magnetic field sensors have respective sensor outputs. The magnetic field sensors are configured to provide magnetic field sensor signals at the respective sensor outputs representative of a measure of current flow through an associated conductive structure. The magnetic field sensors can be spatially arranged and configured to reduce magnetic field variations in the magnetic field sensor signals over a frequency range responsive to current flow through the respective conductive structures. A current sense circuit has sensor inputs and current outputs, in which the sensor inputs are coupled to the respective sensor outputs of the magnetic field sensors. The current sense circuit is configured to provide current measurement signals at the current outputs responsive to the magnetic field sensor signals, in which the current measurement signals are decoupled from magnetic fields generated responsive to the current flow through the conductive structure.

BRIEF DESCRIPTION OF THE DRAWINGS

FIG. 1 shows an example diagram of a magnetic current sensing system.

FIG. 2 is a block diagram of an example magnetic current sensing circuit.

DETAILED DESCRIPTION

Figure 3:
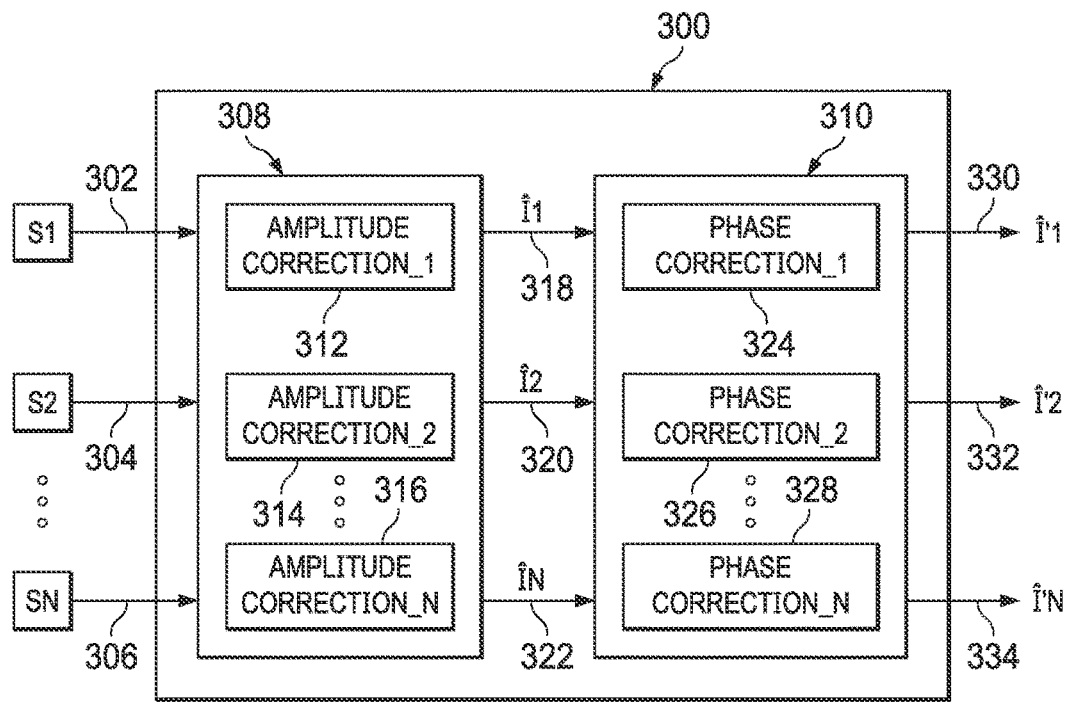
FIG. 3 is a block diagram of an example multi-phase correction circuit.

Example embodiments relate to circuitry and methods configured to perform magnetic current sensing. For example, multiple magnetic sensors can be arranged and configured to sense magnetic fields induced by current flow through a conductive structure, such as a busbar. There can be any number of conductive structures, and magnetic sensors are located at positions relative the respective conductive structures. In an example, the current sensing can be implemented by using Hall-effect sensors (or other magnetic sensors) without magnetic cores to provide shielding. As a result, magnetic coupling may exist at a given conductive structure responsive to current flow through one or more nearby conductive structures. To reduce or minimize the magnetic coupling, magnetic sensors are spatially arranged at locations adjacent the given conductive structure configured to reduce variations (e.g., reduce variations in amplitude and/or phase distortions) in the sensed magnetic fields with respect to frequency of the current.

In a further example, a combiner interface has inputs coupled to outputs of respective magnetic sensors, which are configured and arranged to sense the magnetic field of a given conductive structure. The combiner interface is configured to combine sensor data from the respective magnetic sensors. In an example, the combiner interface includes correction circuit configured to further reduce variations in magnetic coupling among the first and second magnetic field sensors and the first and second conductive structures over a frequency range for the current. For example, the correction circuit is configured to apply weighting responsive to the current flow responsive to current flow through the respective first and second conductive structures.

As used herein, in the context of magnetic field variation, the term minimize and variations of this term refer to an objective design consideration or optimization parameter, in which the actual amount variation can differ from an optimized or desired minimum value. For example, an spatial arrangement and configuration of magnetic sensors to minimize magnetic field coupling may result in some amount of deviation from a minimum magnetic field coupling (e.g., optimized level), such as up to and including +/−5% deviation.

FIG. 1 shows an example of a magnetic current sensing system 100 that is configured to sense current of one or more conductive structures 102 and 104. In the example of FIG. 1, two conductive structures 102 and 104 are shown. In another example, there can be more than two or less than two conductive structures. For example, the conductive structures 102 and 104 are busbars are configured to conduct current along a longitudinal direction between respective ends 106 and 108 and ends 110 and 112. The longitudinal extent of the conductive structures 102 and 104 can be generally straight, although curved, serpentine, curvilinear or other longitudinal conductor structures can be used. Each conductive structure can have a rectangular or other cross-sectional shape.

The current sensing system 100 includes sensor arrays 114 and 116. The sensor array is arranged and configured to sense a magnetic field from the conductive structure 102. The other sensor array 116 is arranged and configured to sense a magnetic field from the conductive structure 104. As described herein, the sensed magnetic field is representative of the current through the respective conductive structures 102 and 104.

The sensor array 114 include multiple magnetic field sensors 118 and 120. For example each sensor is a Hall-effect or other magnetic field sensor. The magnetic field sensors 118 and 120 are located at respective positions with respect to the conductive structure 102 to reduce (or minimize) variations in the sensed magnetic field that can occur responsive to frequency of the current being measured due to skin effects in the conductive structure 102. For example, simulations are performed using software (e.g., Ansys simulation software, available from Ansys, Inc.) to determine respective sensor positions configured to produce sensor signals with reduced amplitude and phase variations across an expected frequency range of current through the conductive structure 102. By positioning the sensors 118 and 120 at positions known to reduce amplitude and phase variations in the sensed magnetic fields, as described herein, more accurate current measurements can be made for the conductive structure 102 over a range of current frequencies.

Sensors 118 and 120 have outputs coupled to respective inputs of a combiner interface 122. The combiner interface 122 includes circuitry configured to combine (e.g., aggregate) the sensor signals from respective sensors 118 and 120 to provide an aggregate sensor signal representative of the current through the conductive structure 102. In an example, the combiner interface 122 is configured to provide an aggregate sensor signal responsive to the magnetic field sensor signals from sensors 118 and 120.

In an example, the sensor array 116 can include multiple sensors 124 and 126 arranged and configured with respect to the conductive structure 104 as described with respect to the sensor array 114. Thus, sensors 124 and 126 can be located at respective positions with respect to the conductive structure 104 to reduce (or minimize) variations in the sensed magnetic field that can occur responsive to frequency of the current being measured. Sensors 124 and 126 also have outputs coupled to respective inputs of the combiner interface 122. The combiner interface 122 is configured to combine (e.g., aggregate) the sensor signals to provide an aggregate sensor signal representative of the current through the conductive structure 104. For example, the combiner interface 122 is configured to provide an aggregate sensor measurement responsive to the magnetic field sensor signals from sensors 124 and 126.

As a further example, the magnetic field induced by current flowing through one or more of conductive structures 102 and 104 can affect the current being measured in one or more other sensor arrays. The variations in coupling among the sensors 118, 120, 124 and 126 and conductive structures 102 and 104 further varies as a function of frequency of the current being measured. Advantageously, the placement of the respective sensors 118, 120, 124 and 126, as described herein, can reduce such frequency-dependent variations in the coupling, across a range of frequencies.

Additionally, in examples where there are two or more conductive structures 102 and 104, the sensing system 100 can also include a correction circuit 130. The correction circuit 130 is configured to reduce (or minimize) the effects of magnetic coupling among the sensors 118, 120, 124 and 126 responsive to current flowing through one or more of the conductive structures 102 and 104. For example, the magnetic coupling can be represented as a coupling matrix configured to characterize magnetic coupling among the magnetic field sensors and the conductive structures responsive to current flow through the conductive structures. As described herein, the correction circuit 130 can be configured to apply weighting responsive to the current flow to decouple the sensors 118, 120, 124 and 126 from the magnetic fields that are generated by the multiple conductive structures 102 and 104. For example, the correction circuit 130 can receive as inputs the measure of current flow, which has been determined responsive to the aggregate magnetic field sensor signals (e.g., signals provided by or derived from sensors 118, 120, 124, 126). As a result, the correction circuit 130 can be simplified compared to existing approaches.

In an example, the correction circuit 130 can be implemented in the analog domain, such as by an analog filter configured to reduce frequency dependent variations in the measured magnetic fields. In another example, the correction circuit 130 can be implemented digitally, such as responsive to digital versions of the combined signal (e.g., by digital filters or computations by a microcontroller unit (MCU) or application specific integrated circuit (ASIC)) configured to correct amplitude and/or phase variations in the sensed signals. In the example of FIG. 1, the correction circuit 130 is shown within combiner interface 122. In other examples, such as shown in FIG. 2, the correction circuit 130 can be separate from the combiner interface 122 (e.g., implemented in the controller 140 or another circuit between the controller and the combiner).

The combiner interface 122 thus is configured to aggregate the measured signals from respective sensors 118-120 and 124-126 and determine respective measures of current flow through the respective conductive structures 102 and 104 responsive to the magnetic field sensor signals. The correction circuit 130 can also be configured to perform amplitude and/or phase correction on the respective measures of current flow to decouple the sensor signals from magnetic fields. The combiner interface 122 has outputs coupled to inputs of the controller 140, such as an MCU or other processing unit. The controller 140 is configured to determine a value for current flowing through the conductive structures 102, 104 responsive to the aggregate sensor signals from the combiner interface 122. As described, the aggregate sensor signals can be corrected versions of the magnetic field signals measured having been compensated for the magnetic coupling effects among the conductive structures 102, 104 and magnetic field sensors 118, 120, 124, 126. The controller can further be configured to control associated circuitry (not shown, but see FIG. 20), such as implemented in a motor driver system (e.g., a traction inverter).

FIG. 2 is a block diagram of an example magnetic current sensing circuit 200. In the example of FIG. 2, the magnetic current sensing circuit 200 is shown as including circuitry configured to measure current for conductive structure 102 of FIG. 1. Accordingly, the description of FIG. 2 also refers to FIG. 1. For example, the circuit 200 includes sensor array 114 (e.g., including magnetic sensors 118 and 120) having outputs coupled to inputs of combiner interface 122. The combiner interface 122 has an output coupled to an input of correction circuit 130, which can have an output coupled to an input of controller 140. The correction circuit 130 can be implemented as an analog filter or the aggregate signal can be digitized through an analog-to-digital converter and the correction circuit 130 can be configured to correct amplitude and/or phase variations digitally.

In the example of FIG. 2, the magnetic sensor 118 is a circuit that includes a Hall-effect sensor 202 and an amplifier, in which the sensor output is coupled to an input of the amplifier 204. The amplifier 204 has an output coupled to an input of the combiner interface 122. Similarly, magnetic sensor 120 includes a Hall-effect sensor 206 having an output coupled to an input of an amplifier 208, and the amplifier 208 has an output coupled to an input of the combiner interface 122. In an example, each of the sensors 118 and 120 are circuits implemented on a respective integrated circuit (IC) die 210 and 212. Additionally, each of the dies 210 and 212 can be mounted at respective locations on a printed circuit (PC) board 214 to position the respective Hall-effect sensors 202 and 206 with respect to the conductive structure 102. The locations of the Hall-effect sensors 202 and 206 with respect to the conductive structure 102 can be set so variations in the measured magnetic field responsive to frequency changes in the current being measured are reduced in the aggregate measured magnetic field (provided by the combiner interface 122). For example, the locations of the Hall-effect sensors 202 and 206 are fixed on the PC board 214, such as can be determined by computer simulation or experimentally (e.g., by testing or device characterization). Thus, by mounting the PC board 214 with respect to the conductive structure 102 (e.g., a busbar), variations in measured magnetic field due to current frequency changes can be reduced.

As shown in FIG. 2, the combiner interface 122 can be implemented as a local combiner interface for a set of magnetic field sensors 118 and 120 that are configured to measure the magnetic field of a respective conductive structure 102. The local combiner interface 122 can be implemented on the PC board 214, such as integrated in one of the IC dies 212 or as a separate circuit on the PC board. The combiner interface 122 can be implemented as a summing circuit (e.g., a summing amplifier) or simply by coupling the outputs of respective amplifiers 204 and 208 together. Alternatively, the combiner interface 122 can be separate from the PC board 214, such as coupled to the sensor IC circuits 210 and 212 through respective interconnects (e.g., wires or traces).

For example, the combiner interface 122 is analog or digital circuitry configured to perform a summation (or differentiation) of outputs of 208 and 204. As an example in the analog domain, combiner interface 122 is a summing operational amplifier configured to sum or differentiate the outputs of 208 and 204. As an example in the digital domain, combiner interface 122 includes an analog-to-digital converter configured to digitize respective outputs of 208 and 204 and digital circuitry (e.g., a processor or digital ASIC) configured to sum or differentiate digital versions of the respective outputs of 208 and 204. In an example, the combiner interface 122 also includes a coupling matrix that is applied to the amplified field sensor signals provided by amplifiers 204 and 204 to provide a decoupled measure of current flow through the conductive structure 102. The coupling matrix can be configured to characterize magnetic coupling among the Hall-effect sensors 202 and 206 responsive to current flow through the respective conductive structure 102

An instance of the circuit 200 can be provided with respect to each respective conductive structure 102 and 104 of the system 100, and configured to provide respective current measurements for the conductive structures. In an example, the respective instances of the circuit 200 are mounted at respective locations on the same PC board 214.

FIG. 3 is a block diagram of an example multi-phase correction circuit 300. The correction circuit 300 includes inputs 302, 304, 306 coupled to outputs of current sensing circuits S1, S2 through SN, where N is a positive integer denoting the number of phases for which current is measured. For example, each phase includes a busbar (or other conductive structure), in which each current sensing circuit S1, S2 and SN is configured to sense the magnetic field of a respective busbar. Each current sensing circuit S1, S2 and SN can be implemented according to the example sensor array 114 shown in FIGS. 1 and 2 and thus can include two or more magnetic field sensors 118 and 120 and respective amplifiers 204 and 208. In an example, each of the sensing circuits S1, S2 and SN also includes combiner interface 122 configured to aggregate the amplified magnetic field sensor signals for the respective conductive structure and provide the aggregate sensor signal to respective inputs 302, 304 and 306 of the correction circuit 300. In another example, each sensing circuits S1, S2 and SN includes a single instance of sensor 202 and amplifier 204, and the combiner would be omitted. For example, the combiner interface of sensing circuits S1, S2 and SN includes a correction circuit 130 configured to decouple the sensor signals from magnetic coupling responsive to current flowing through respective conductive structures. Sensing circuits S1, S2 and SN thus are configured to produce a measure of current flow for each of respective conductive structures. The signals provided at 302, 304 and 306 can also be digitized (e.g., by respective analog-to-digital converters—not shown) to provide digital versions of the measures of current flow to the respective inputs 302, 304 and 306 of correction circuit 300.

In the example of FIG. 3, the correction circuit 300 includes amplitude correction circuitry 308 and phase correction circuitry 310. For example, the amplitude correction circuitry 308 and phase correction circuitry 310 are implemented by an arrangement of analog filters. In another example, the amplitude correction circuitry 308 and phase correction circuitry 310 are implemented digitally, such as by discrete logic components and/or by machine-readable instructions executed by one or more processing core or a digital ASIC (see, e.g., FIGS. 4 and 5).

The amplitude correction circuitry 308 includes amplitude correction circuits 312, 314, and 316 configured to perform amplitude correction with respect to the signals received at 302, 304, and 306, respectively. As described herein, each of the respective circuits 312, 314, and 316 is configured to implement amplitude correction for a respective isolated phase responsive to the input signals received at the inputs 302, 304 and 306. For example, the amplitude correction circuits 312, 314, and 316 are configured to compensate for magnetic cross coupling that occurs among the conductive structures and sensing circuits S1, S2 and SN responsive to current through the conductive structures. The amplitude correction circuits 312, 314, and 316 can also be configured to compensate for variations in amplitude due to changes in frequency of the current being measured. Each of the amplitude correction circuits 312, 314 and 316 thus is configured to provide respective amplitude corrected signals for each conductive structure, shown as $\hat{I}1$, $\hat{I}2$ and $\hat{I}N$, to inputs 318, 320 and 322 of the phase correction circuit 310. For example, the amplitude-corrected current signals $\hat{I}1$, $\hat{I}2$ and $\hat{I}N$ are represented as a matrix, such as follows:

$$\begin{bmatrix} \hat{I}_1 \\ \hat{I}_2 \\ \hat{I}_3 \end{bmatrix} = \begin{bmatrix} w_{11}(f) & w_{12}(f) & w_{13}(f) \\ w_{21}(f) & w_{22}(f) & w_{23}(f) \\ w_{31}(f) & w_{32}(f) & w_{33}(f) \end{bmatrix} \text{Re} \begin{bmatrix} \tilde{b}_1 \\ \tilde{b}_2 \\ \tilde{b}_3 \end{bmatrix} \quad \text{Eq. 1}$$

where the weighting matrix includes computed weights for combining the sensor data, which is multiplied by the real component of the sensed magnetic field matrix. The weights for at a given set of frequencies of current being measured can be computed according to the following:

$$W(f) = \text{Re}\left\{\left[\tilde{A}^H(f)\tilde{A}(f)\right]^{-1}\tilde{A}^H(f)\right\} \quad \text{Eq. 2}$$

where H is Hermitian transpose. A(f) is the frequency dependent coupling matrix (e.g., defined as below for 3 sensor example).

The frequency of current can be estimated in real-time responsive to sensor position data and/or speed of the electric machine, as follows:

$$\begin{bmatrix} \tilde{b}_1 \\ \tilde{b}_2 \\ \tilde{b}_3 \end{bmatrix} = \begin{bmatrix} \tilde{a}_{11}(f) & \tilde{a}_{12}(f) & \tilde{a}_{13}(f) \\ \tilde{a}_{21}(f) & \tilde{a}_{22}(f) & \tilde{a}_{23}(f) \\ \tilde{a}_{31}(f) & \tilde{a}_{32}(f) & \tilde{a}_{33}(f) \end{bmatrix} \begin{bmatrix} I_1 \\ I_2 \\ I_3 \end{bmatrix} = \tilde{A}(f) \begin{bmatrix} I_1 \\ I_2 \\ I_3 \end{bmatrix} \quad \text{Eq. 3}$$

The phase correction circuit 310 also includes a phase correction circuit 324, 326 and 328 configured to compute phase corrections for each of the respective sensor signals and provide corrected signals $\hat{I}'1$, $\hat{I}'2$ and $\hat{I}'N$. As described herein, the phase correction circuits 324, 326 and 328 are configured to implement phase correction for a respective isolated phase of the conductive structure responsive to the amplitude corrected signals as $\hat{I}1$, $\hat{I}2$ and $\hat{I}N$ provided at inputs 318, 320 and 322. For example, the phase correction circuits 324, 326 and 328 are configured to compensate phase variations responsive to cross-coupling that occurs among the conductive structures and sensing circuits S1, S2 and SN when current flows through the conductive structures. The phase correction circuits 324, 326 and 328 can also be configured to compensate for phase shift and variations in phase due to changes in frequency of the current being measured through respective conductive structures. For example, the phase-corrected current signals $\hat{I}'1$, $\hat{I}'2$ and $\hat{I}'N$ are represented as a matrix, such as follows:

$$\begin{bmatrix} \hat{I}'_1 \\ \hat{I}'_2 \\ \hat{I}'_3 \end{bmatrix} = \text{Re}\left\{\tilde{W}(f) \begin{bmatrix} \hat{I}_1 + j(\hat{I}_3 - \hat{I}_2)/\sqrt{3} \\ \hat{I}_2 + j(\hat{I}_1 - \hat{I}_3)/\sqrt{3} \\ \hat{I}_3 + j(\hat{I}_2 - \hat{I}_1)/\sqrt{3} \end{bmatrix}\right\} \quad \text{Eq. 4}$$

where the weighting matrix includes computed weights for combining the sensor data, which is multiplied by the complex values of the amplitude corrected current values.

The weights for at a given set of frequencies of current being measured can be computed according to the following:

$$\tilde{W}(f)=(\text{Re}[(\tilde{A}^H(f)\tilde{A}(f))^{-1}\tilde{A}^H(f)]\tilde{A}(f))^{-1} \qquad \text{Eq. 5}$$

In some examples, the amplitude correction circuits 312, 314 and 316 as well as the phase correction circuits 324, 326 and 328 are simplified or configured to implement respective corrections independent of frequency. This is because the arrangement of respective sensors 118, 120, 124, and 126 can be positioned with respect to the busbars to reduce cross-coupling among the sensors as well as to reduce frequency-dependent variations in the sensed magnetic fields as frequency changes in the current through the busbars. For example, the weighting and/or combining coefficients are fixed with values calibrated at DC or one particular AC frequency of the current (e.g., 100 Hz).

Figure 4:
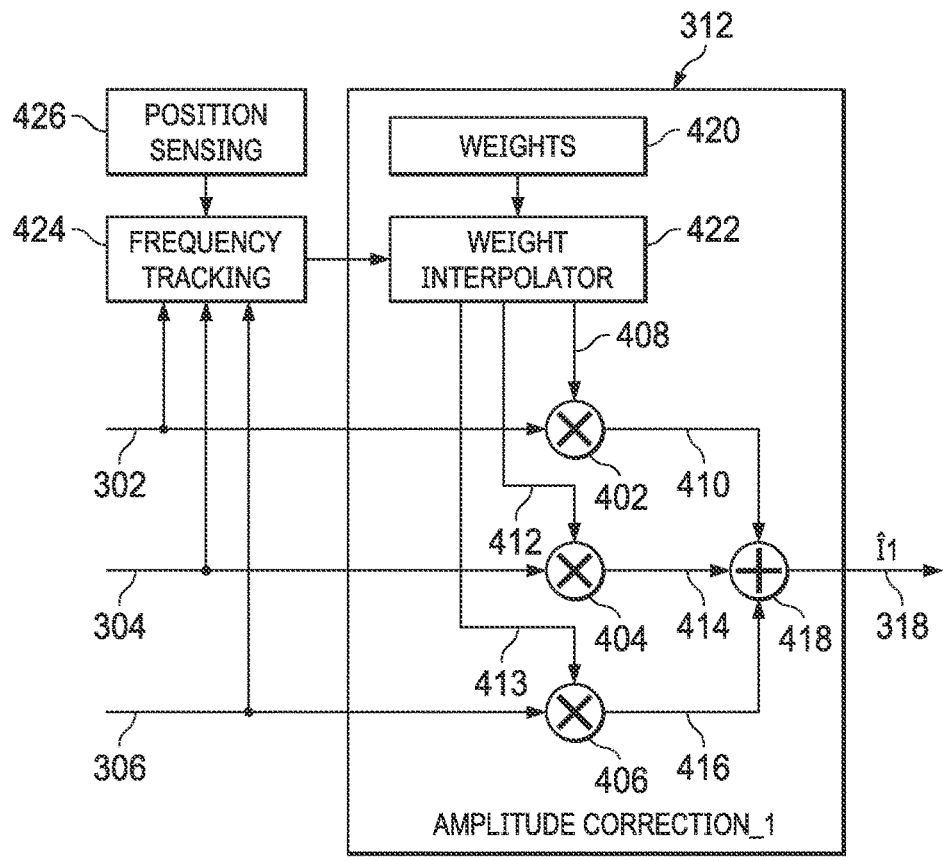
FIG. 4 is a block diagram showing an example of an amplitude correction circuit that can be implemented in the correction circuit of FIG. 3.

As a further example, FIG. 4 depicts an example of the amplitude correction circuit 312 of FIG. 3. Accordingly, the description of FIG. 4 also refers to FIGS. 1, 2 and 3. Each of the other amplitude correction circuits 314 and 316 can be implemented in a like manner to the amplitude correction circuitry 312 shown in FIG. 4.

For example, the amplitude correction circuit 312 includes respective inputs 302, 304, and 306 configured to receive respective current measurement signals from sensor circuits S1, S2 and SN. In the example of FIG. 4, the amplitude correction circuitry 312 is implemented in the digital domain, such as instructions executable by a processor core, or digital ASIC implementations. Each of the inputs 302, 304 and 306 receives a digital signal representative of a respective current measurement signal responsive to the aggregated sensed magnetic fields. The current measurement signals at 302, 304 and 306 are provided as inputs to respective multiplier blocks 402, 404 and 406. The multiplier 402 also receives a weight at another input 408 and multiplies the weight by the measurement at 302 to provide a weighted indication of current for sensor S1 at output 410. Similarly multipliers 404 and 406 each receives respective weights at inputs 412 and 413, which is multiplied by the measure of input current at 304 and 306 to provide weighted indications of current measurements at outputs 414 and 416. The weighted current measurements at 410, 414 and 416 thus are provided as inputs to a summation block 418 to provide an amplitude-corrected current Î1 at 318.

Weight values for each of the respective inputs 302, 304, 306 can be stored in memory (e.g., a register or other memory structure) 420. In some examples, such as when the frequency-dependent variations have been sufficiently reduced or eliminated, the weights are provided from the memory 420 directly to multiplier inputs 408, 412 and 413. By providing the weight directly to the multipliers 402, 404 and 406, additional computations and circuitry (shown at 422, 424 and 426) can be omitted from the amplitude circuit 312.

In another example the amplitude circuit 312 can include a weight interpolator 422. The weight interpolator 422 is configured to select and interpolate among the stored weight values based on one or more sensed conditions. For the example, where the sensors are configured to measure current of a multi-phase electric machine, such as a motor or generator, the weight interpolator 422 can be configured to interpolate among the stored weight values in memory 420 responsive to a frequency of the current being measured and/or a position of the electric machine. For example, a frequency tracking circuit 424 is coupled to inputs 302, 304 and 306 and configured to determine the frequency of the measured signals at such inputs. The frequency tracking circuit 424 thus can provide an indication of the frequency for the current measured at 302 as an input to the interpolator 422. The interpolator 422 is configured to interpolate the stored weight values from memory 420 responsive to the indication of frequency from the frequency tracking circuit 424.

In a further example, a position sensing circuit 426 (e.g., an encoder) is coupled to the electric machine and configured to provide a position signal to the frequency tracking circuit 424 representative of a sensed position of the electric machine (e.g., rotor position). The position sensing circuit 426 can be used by a control system (e.g., MCU or other controller) to control commutation of an electric machine. For example, the position sensing circuit 426 is an incremental encoder or an absolute encoder configured to provide the position signal having a value representative of mechanical or electrical degrees or otherwise correlated to a position of a rotor relative to a stator. The frequency tracking circuit 424 can be configured to determine which one or more of the current measurement signals at 302, 304, and 306 is an active measurement responsive to the position signal from the position sensing circuit 426. As an example, the position sensing circuit can provide an output as revolutions per minute (RPM), and, the frequency of the current of a motor (or generator) can be calculated as a function of the RPM and the number of poles (e.g., frequency=RPM*number of poles in the motor/120).

For example, current may flow through one or more of the busbars (or other conductive structures) dependent on the position of the electric machine. In this way, the frequency tracking circuit 424 can provide a value representative of frequency for current that is flowing through one or more busbars to enable the appropriate correction circuit 312, 314 and/or 316 to implement amplitude based corrections. Thus responsive to the frequency of the phase or phases of interest, the weight interpolator 422 can applied adjusted weight values to respective multipliers 402, 404 and 406. The adjusted weight values thus can be provided to inputs 408, 412 and 413 for applying respective weighting to the current signal measurement signals at 302, 304, and 306 and generating the amplitude-corrected current Î1 at 318.

Figure 5:
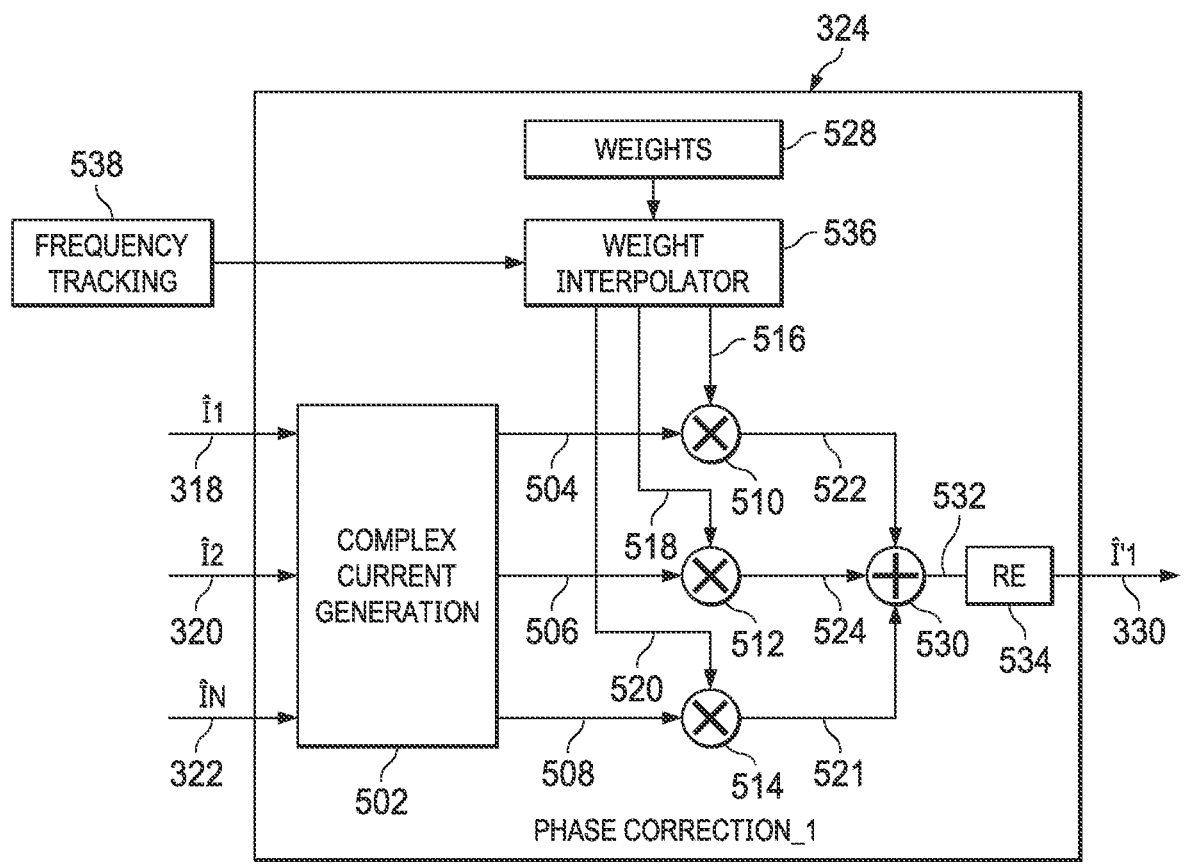
FIG. 5 is a block diagram showing an example of a phase correction circuit that can be implemented in the correction circuit of FIG. 3.

FIG. 5 depicts an example of the phase correction circuit 324 of FIG. 3. Accordingly the description of FIG. 5 also refers to FIGS. 1, 2, and 3. In the example of FIG. 5, phase correction circuit 324 receives amplitude corrected signals Î1, Î2 and ÎN at respective inputs 318, 320 and 322, such as generated by respective amplitude correction circuits 312, 314 and 316.

The indication of current measurements provided at 302, 304 and 306 include real and imaginary parts, such as can be expressed as follows:

$$\begin{bmatrix} I_1 \\ I_2 \\ I_3 \end{bmatrix} = \begin{bmatrix} A_I \cos(\omega t) \\ A_I \cos(\omega t + 2\pi/3) \\ A_I \cos(\omega t + 4\pi/3) \end{bmatrix} \qquad \text{Eq. 6}$$

A relationship among the complex current values can be expressed as follows:

$$\begin{bmatrix} I_1 - I_3 \\ I_2 - I_1 \\ I_3 - I_2 \end{bmatrix} = \begin{bmatrix} \sqrt{3} A_I \sin(\omega t + 2\pi/3) \\ \sqrt{3} A_I \sin(\omega t + 4\pi/3) \\ \sqrt{3} A_I \sin(\omega t) \end{bmatrix}. \qquad \text{Eq. 7}$$

The phase correction circuit 324 thus includes a complex current generation circuit 502 configured to convert the amplitude-corrected currents ILL and IN to respective complex values representative of the amplitude-corrected currents. For example, the complex current generator circuit 502 is configured to utilize the relationships among the multi-phase currents that are measured (e.g., as shown above) to generate the corresponding complex current values that outputs 504, 506 and 508. Each of the outputs 504, 506 and 508 are coupled to inputs of respective multipliers 510, 512 and 514.

Respective weights for each of the phases are applied to other inputs 516, 518 and 520 of the respective multipliers 510, 512, and 514. For example, the weights are pre-computed weights, such as the complex weight matrix $\tilde{W}(f)$ described above. The multipliers 510, 512 and 514 are thus configured to multiply the applied weights by the complex value amplitude corrected currents at 504, 506 and 508 to provide weighted complex current values at multipliers outputs 522, 524 and 526. A summation block 530 can be configured to add the weighted complex, amplitude-corrected current values to provide the complex weighted current value at output 532. A converter 534 can be configured to convert the complex value at 532 into a numeric value provided at 330, shown as Î'1.

In some examples, the weighting that is applied to 516, 518 and 520 is dependent on frequency. In such a frequency-dependent example, the phase correction circuit 324 includes a weight interpolator 536. The weight interpolator 536 can be configured to interpolate among the weigh values stored in memory 528 responsive to the frequency of the current being measured similar to the interpolator 422 of FIG. 4. For example, when a new frequency update is available from the frequency tracking block, the new weight is calculated as $$W(f_{new}) = W(f_1) + \frac{f_{new} - f_1}{f_2 - f_1}[W(f_2) - W(f_1)],$$

in which the interpolator 536 is configured to linearly interpolate between weights (e.g., pre-calculated and stored in non-volatile memory 528) at two frequencies f2 and f1, where f1<f2. For example, the weight interpolator 536 has an input coupled to frequency tracking circuit 538 to receive frequency data. For example, the frequency tracking circuit 538 is configured to provide an indication of frequency for the current signal being phase corrected. For example, frequency tracking circuit 538 has inputs coupled to current inputs 302, 304 and 306 and be configured to determine the frequency of the current measurement being processed. The weight interpolator 536 can adjust and interpolate the weight values that are stored in memory 528 responsive to the frequency of the current measurement (I1) being corrected. The weight interpolator 536 provides the frequency-dependent weight values to respective multiplier inputs 516, 518 and 520 for producing the resulting amplitude- and phase-corrected current measurement Î'1 at 330.

Figure 6:
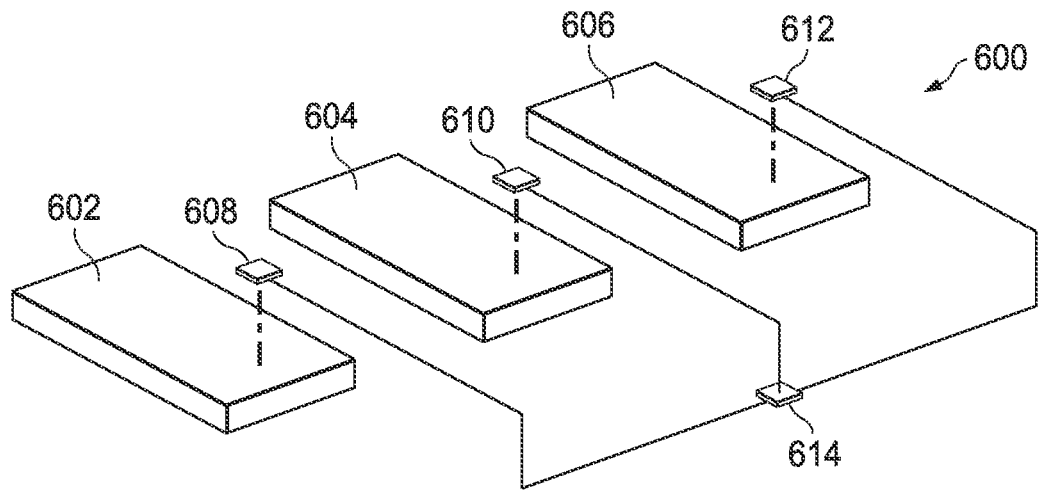
FIG. 6 is an example diagram of a multi-phase current sensing system.

FIG. 6 is a schematic example of a sensor array 600 configured for measuring current through respective busbars 602, 604 and 606, such as part of an electromotive system. The sensor array 600 includes respective magnetic field sensor circuits 608, 610 and 612. Each of the magnetic field sensor circuits 608,610 and 612 are coupled to a combiner, shown schematically at 614.

In the example of FIG. 6, the magnetic field sensor circuit 608 is configured to sense current through busbar 602. The magnetic field sensor circuit 610 is configured to measure current through busbar 604. The magnetic sensor 612 is configured to measure current through busbar 606. Each of the sensor circuits 608, 610 and 612 can be configured as shown in the example of FIG. 2, such as including a Hall-effect sensor and an amplifier, which may be implemented on a die. The combiner interface 614 is configured to aggregate the measured signals from each of the respective magnetic sensor circuits 608, 610, and 612 and provide an aggregate output, such as described herein. For example, the combiner interface 614 is configured to apply the inverse of a coupling matrix to the measured magnetic field measurements to compensate for magnetic coupling effects that occur between the busbars 602, 604 and 606 and the respective sensor circuits 608, 610 and 612. The combiner interface 614 thus is configured to perform frequency-based correction and send corrected current measurement data to an upstream processor (or other upstream circuitry) for further processing. An example coupling matrix Ã is determined based on circuit characterization (e.g., by computer simulation) for a given application. The coupling matrix Ã thus can be determined to describe the relationship among current measurement signals for conductive structures with respect to the magnetic field measurements sensed by magnetic field sensors responsive to current flow through one or more of the conductive structures (e.g., busbars). An example coupling matrix Ã can be expressed as follows:

$$\begin{bmatrix} \tilde{b}_1 \\ \tilde{b}_2 \\ \tilde{b}_3 \end{bmatrix} = \begin{bmatrix} \tilde{a}_{11} & \tilde{a}_{12} & \tilde{a}_{13} \\ \tilde{a}_{21} & \tilde{a}_{22} & \tilde{a}_{23} \\ \tilde{a}_{31} & \tilde{a}_{32} & \tilde{a}_{33} \end{bmatrix} \begin{bmatrix} \tilde{I}_1 \\ \tilde{I}_2 \\ \tilde{I}_3 \end{bmatrix} = \tilde{A} \begin{bmatrix} \tilde{I}_1 \\ \tilde{I}_2 \\ \tilde{I}_3 \end{bmatrix} \qquad \text{Eq. 8}$$

where $\tilde{b}_1$ is the magnetic field measured by sensor 608, $\tilde{b}_2$ is the magnetic field measured by sensor 610, and $\tilde{b}_3$ is the magnetic field measured by sensor 612.

The amplitude corrected current measurements can be determined as a matrix from the above equation, such as follows:

$$\begin{bmatrix} I_1 \\ I_2 \\ I_3 \end{bmatrix} = \text{Re}[\tilde{A}^{-1}]\text{Re}\begin{bmatrix} \tilde{b}_1 \\ \tilde{b}_2 \\ \tilde{b}_3 \end{bmatrix} \qquad \text{Eq. 9}$$

In an example, the combiner interface 614 is configured to implement amplitude and phase correction for each of the respective measured signals, such as shown and described herein with respect to FIGS. 4 and 5.

Figure 7:
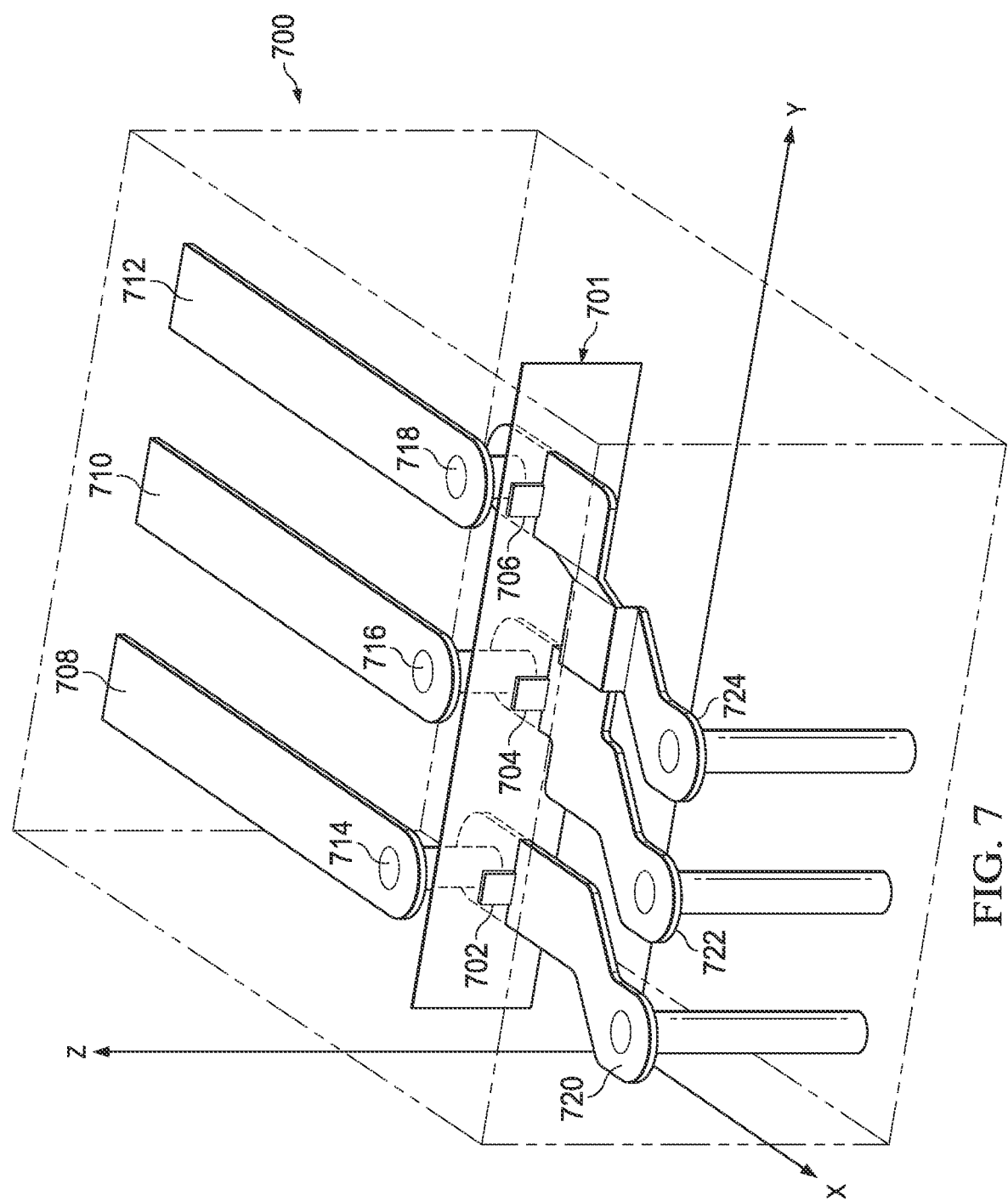
FIG. 7 is a perspective view of a magnetic current sensors coupled to a busbar.

As a further example, FIG. 7 shows a busbar structure 700 and a current sensing system, which includes magnetic field sensor circuits 702, 704 and 706. The busbar 700 includes the plurality of busbars 708, 710 and 712. Each of the busbars includes a through-hole connector 714, 716 and 718 that electrically couples busbar portions 708, 710 and 712 to respective busbar portions 720, 722 and 724. In the example of FIG. 7, respective magnetic sensor circuits 702, 704 and 706 are positioned along busbar extensions 720, 722 and 724 and are configured to measure current through the respective busbars. Each of the sensor circuits 702, 704 and 706 can be configured as the circuits shown in FIG. 2, such as including a Hall-effect sensor and an amplifier. In this configuration, the sensor circuits 702, 704 and 706 are configured to provide a measure of sensed magnetic field for each of the respective busbars 708, 710 and 712. As described herein, the respective magnetic field measurements can be combined and corrected to provide respective current measurements for the respective busbars 708, 710 and 712.

Figure 8:
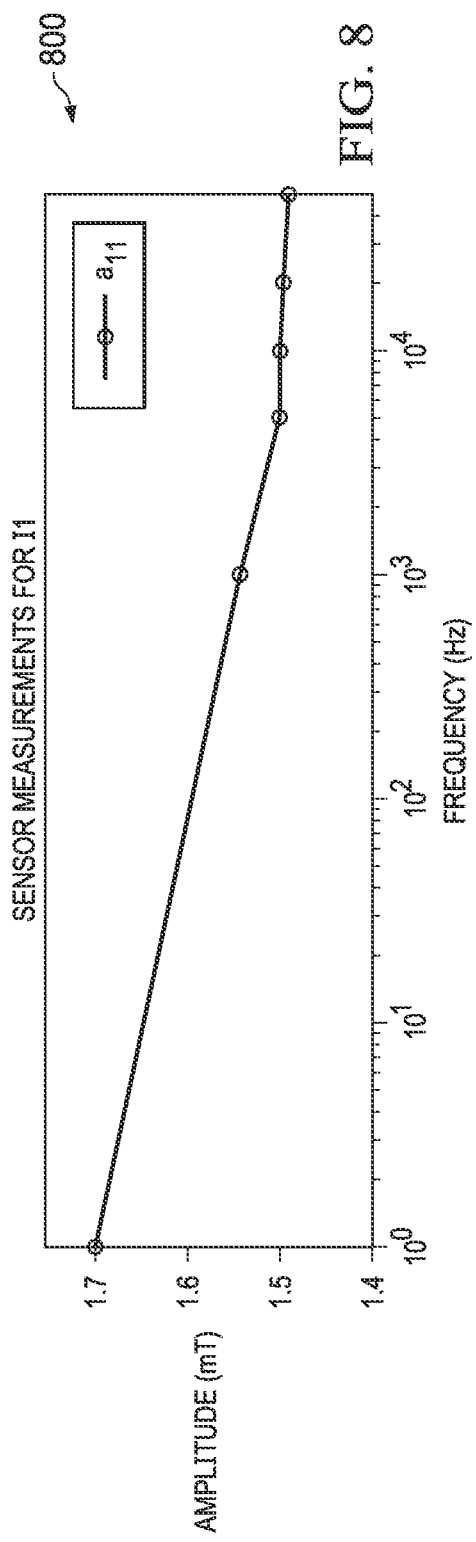
FIG. 8 is a plot of measured magnetic field amplitude as a function of frequency for a respective sensor in FIG. 7.
Figure 9:
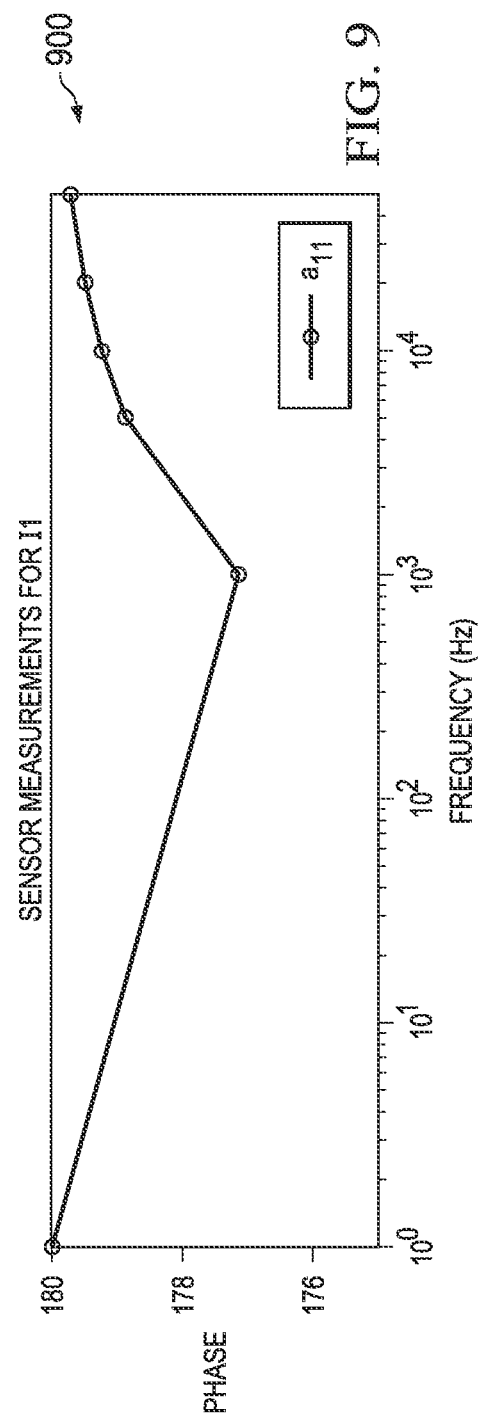
FIG. 9 is a plot of measured magnetic field phase as a function of frequency for a respective sensor in FIG. 7.

FIGS. 8 and 9 are plots 800 and 900 showing examples of amplitude and phase components of current for busbars 708 based on magnetic field measured by magnetic sensor circuit 702. The plot 800 in FIG. 8 shows a measure of the measure of the amplitude portion over a range of frequencies. In FIG. 9, the plot 900 shows a measure of phase over the same frequency range as FIG. 8. As shown in the examples of FIGS. of 8 and 9, variation due to magnetic coupling from other sensors occurs over frequency, such as described herein. By way of example, the magnetic field measurements for when current is supplied to busbar 708 can be represented as follows:

$$\begin{bmatrix} \tilde{b}_1 \\ \tilde{b}_2 \\ \tilde{b}_3 \end{bmatrix} = \begin{bmatrix} 1.54e^{j177.2°} & 0.006e^{-j4.9°} & 0.09e^{-j0.77°} \\ 0.03e^{-j15.9°} & 1.51e^{j177.1°} & 0.24e^{j2.2°} \\ 0.04e^{j3.1°} & 0.05e^{j4.5°} & 1.07e^{-j4.3°} \end{bmatrix} \begin{bmatrix} \tilde{I}_1 \\ \tilde{I}_2 \\ \tilde{I}_3 \end{bmatrix} \quad \text{Eq. 10}$$

where the coupling coefficients are complex values, and variations exist over the range of frequencies shown.

Figure 10:
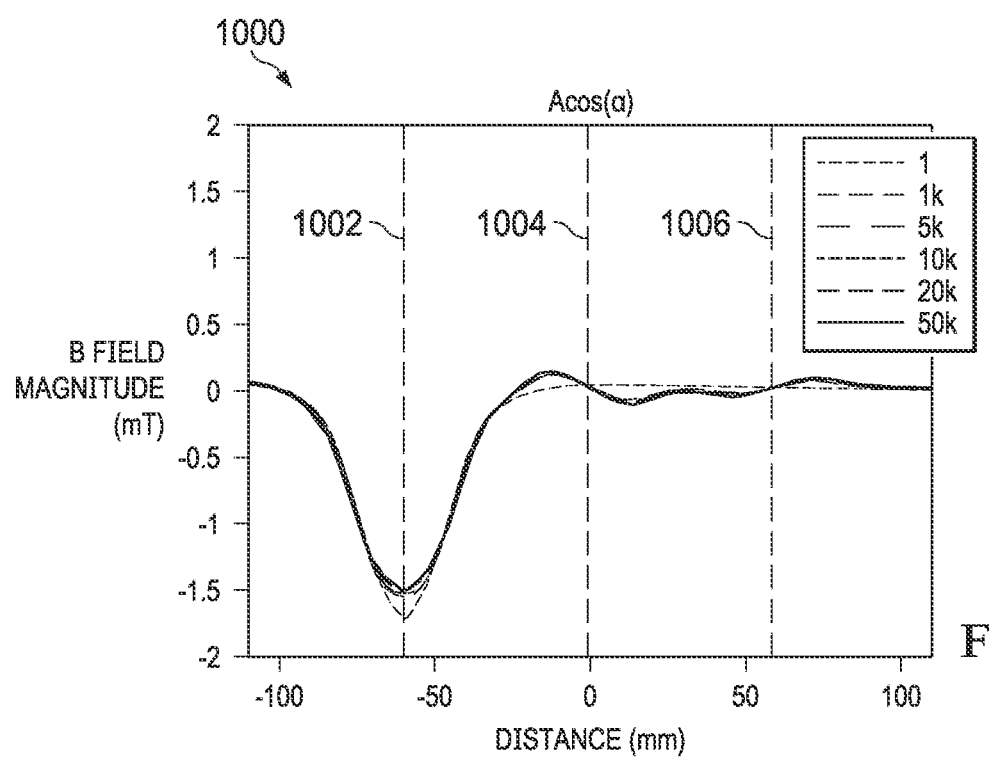
FIG. 10 is a graph of a real portion of magnetic field plotted as a function of location for a respective sensor in FIG. 7 over a range of frequencies.
Figure 11:
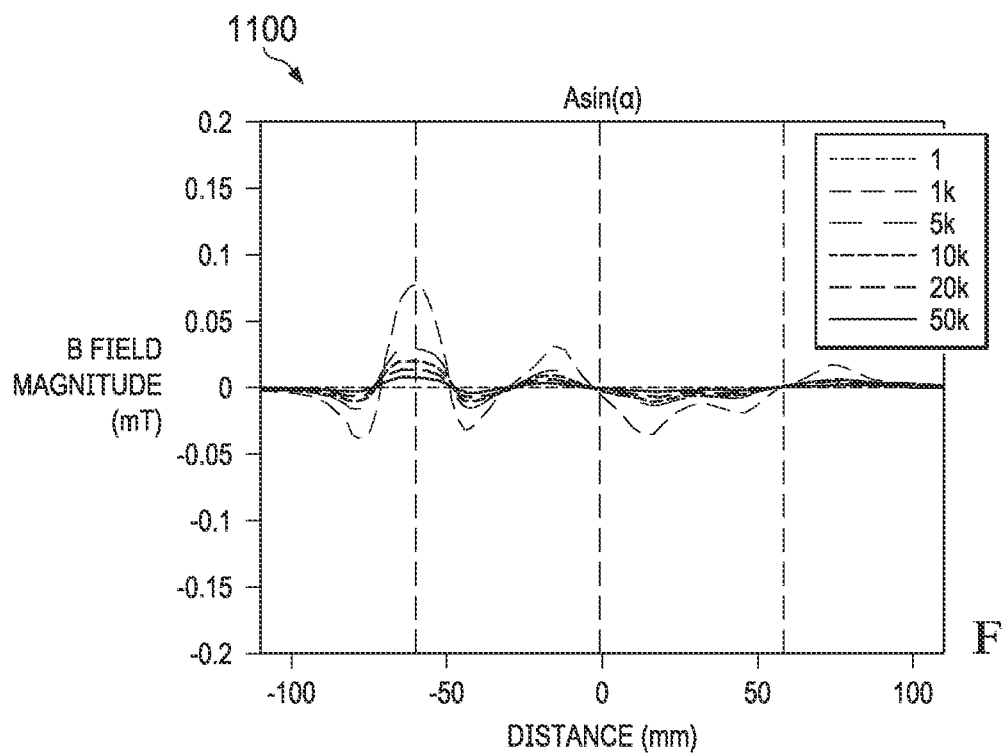
FIG. 11 is a graph of an imaginary portion of magnetic field plotted as a function of location for a respective sensor in FIG. 7 over a range of frequencies.

FIGS. 10 and 11 are plots 1000 and 1100 showing examples of real and imaginary values of magnetic field as a function of distance for the magnetic fields are measured by respective sensor circuits 702, 704 and 706 responsive to current supplied only to busbar 708 (e.g., no current is supplied to busbars 710 and 712). The plots 1000 and 1100 further show the magnetic field measured for a set of frequencies, including 1 kHz, 5 kHz, 10 kHz, 20 kHz and 50 kHz. In the example of FIG. 10, dashed lines 1002, 1004 and 1006 represent locations of magnetic field sensors of respective circuits 702, 704 and 706. Thus, the position of magnetic field sensor of sensor circuit 702 at 1002 shows the biggest variation of current being measured through the busbar 708, whereas dashed lines 1004 and 1006 show induced current measured by magnetic field sensors of circuits 704 and 706 responsive to magnetic coupling due to current through the busbar 708. FIGS. 10 and 11 thus show that positioning the respective sensors of circuits 702, 704 and 706 can affect the measured magnetic fields, including variations thereof over frequency.

Figure 12:
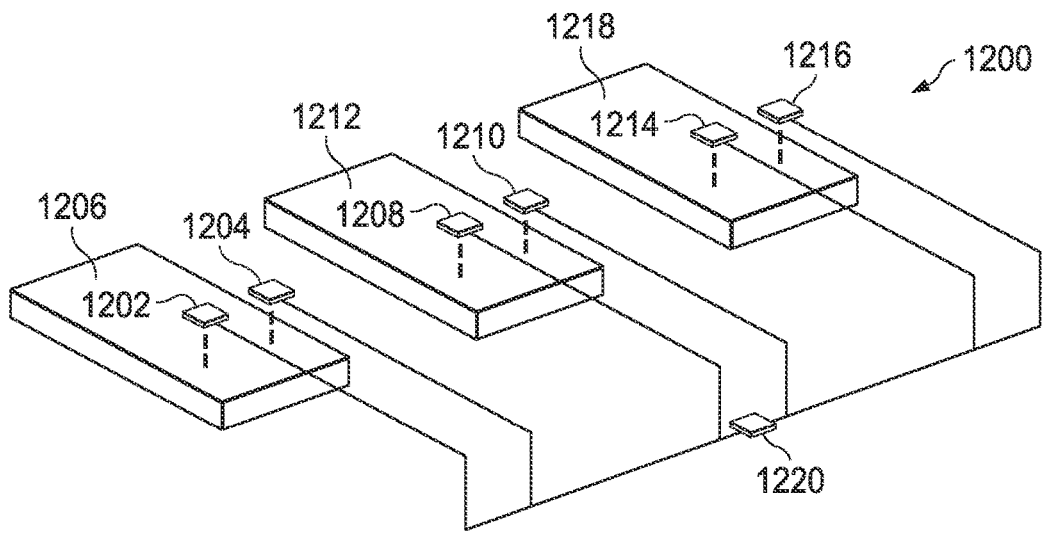
FIG. 12 is a diagram of another example multi-phase current sensing system.

FIG. 12 shows another example of a sensor array 1200 configured to measure electrical current for a multi-phase busbar (e.g., including busbars 1206, 1212, 1218). For example, the sensor array 1200 includes a pair of magnetic field sensors 1202 and 1204 configured to measure the magnetic field from busbar 1206. The array 1200 also includes sensors 1208 and 1210 configured to measure the magnetic field, which is representative electrical current through busbar 1212. Magnetic sensors 1214 and 1216 are configured to measure the magnetic field from busbar 1218. In other examples, different numbers of magnetic field sensors could be used to measure the magnetic field of each of the busbars 1206, 1212 and 1218. In the example of FIG. 12, each of the sensors 1202, 1204, 1208, 1210, 1214, and 1216 is coupled to a combiner interface 1220 which is configured to combine the respective signals. In some examples, the combiner interface 1220 is also configured to implement cross-coupling compensation, as described herein, for reducing induced variations in magnetic field measurements produced by the respective sensors 1202, 1204, 1208, 1210, 1214 and 1216.

For example, the combiner interface 1220 includes correction function (e.g., correction circuit 130) configured to apply a decoupling matrix (e.g., a weighted inverse of a coupling matrix for the sensing system) to the aggregated magnetic field, measurements to compensate for magnetic coupling effects that occur between the busbars 1206, 1212 and 1218 and the respective sensors 1202, 1204, 1208, 1210, 1214 and 1216. An example coupling matrix $\tilde{A}$ can be determined based on circuit characterization (e.g., by computer simulation) for a given application. An example coupling matrix $\tilde{A}$ is as follows:

$$\begin{bmatrix} \tilde{b}_1 + \tilde{b}_2 \\ \tilde{b}_3 + \tilde{b}_4 \\ \tilde{b}_5 + \tilde{b}_6 \end{bmatrix} = \begin{bmatrix} \tilde{a}_{11} & \tilde{a}_{12} & \tilde{a}_{13} \\ \tilde{a}_{21} & \tilde{a}_{22} & \tilde{a}_{23} \\ \tilde{a}_{31} & \tilde{a}_{32} & \tilde{a}_{33} \end{bmatrix} \begin{bmatrix} \tilde{I}_1 \\ \tilde{I}_2 \\ \tilde{I}_3 \end{bmatrix} = \tilde{A} \begin{bmatrix} \tilde{I}_1 \\ \tilde{I}_2 \\ \tilde{I}_3 \end{bmatrix} \quad \text{Eq. 11}$$

where $\tilde{b}_1$, $\tilde{b}_2$ are magnetic field measurements provided by sensors 1202 and 1204, $\tilde{b}_3$, $\tilde{b}_4$ are magnetic field measurements provided by sensors 1208 and 1210, and $\tilde{b}_5$, $\tilde{b}_6$ are magnetic field measurements provided by sensors 1214 and 1216.

The amplitude corrected current measurements for each of the busbars 1206, 1212 and 1218 can be determined as a matrix from the above equation, such as follows:

$$\begin{bmatrix} \tilde{I}_1 \\ \tilde{I}_2 \\ \tilde{I}_3 \end{bmatrix} = \text{Re}[\tilde{A}^{-1}] \text{Re} \begin{bmatrix} \tilde{b}_1 + \tilde{b}_2 \\ \tilde{b}_3 + \tilde{b}_4 \\ \tilde{b}_5 + \tilde{b}_6 \end{bmatrix} \quad \text{Eq. 12}$$

Additionally, the combiner interface 1220 or separate correction circuitry can be configured to perform amplitude and phase correction, as also described herein.

Figure 13:
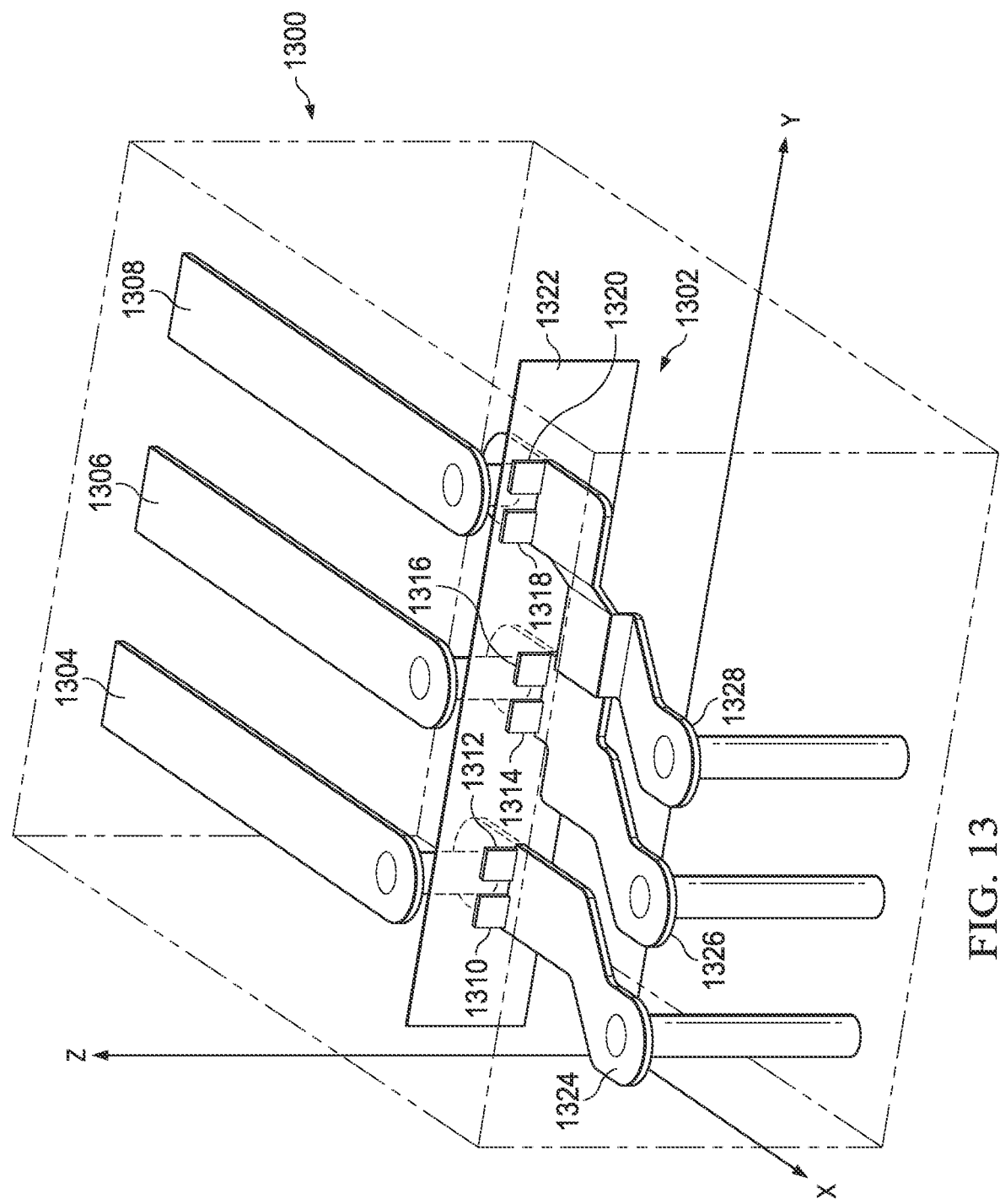
FIG. 13 is a perspective view of a magnetic current sensors coupled to a busbar.

FIG. 13 shows an example of busbar structure 1300 and a current sensing system 1302 configured to measure an electrical current for respective busbars 1304, 1306 and 1308 of the busbar structure 1300. In the example of FIG. 13, the current sensing system 1302 includes multiple sensors (e.g., two sensors) arranged and configured to sense the magnetic fields for each of the respective busbars 1304, 1306 and 1308 and provide respective signals representative of the measured magnetic fields. For example, the current sensing system 1302 includes a pair of magnetic sensors 1310 and 1312 configured to measure current for busbar 1304. Magnetic sensors 1314 and 1316 are configured to measure the magnetic field of busbar 1306, and magnetic sensors 1318 and 1320 are configured to measure current for busbar 1308. As described herein the measured magnetic fields are representative of the current flowing through the respective busbars 1304, 1306 and 1308.

The respective magnetic sensors 1310, 1312, 1314, 1316, 1318, and 1320 can be implemented according to the example circuit shown in FIG. 2 or otherwise described herein, such as including a Hall-effect sensor and an amplifier. Each of the sensors 1310, 1312, 1314, 1316, 1318, and 1320 further can be coupled to a combiner (not shown—but see FIGS. 1, 2 and 12) configured to combine the respective current measurements to provide an aggregate measurement for each of the respective busbar. Additional correction circuitry can also be implemented with respect to the combined current measurements as described herein (see, e.g., FIGS. 4 and 5).

In example of FIG. 13, each of the magnetic sensors 1310, 1312, 1314, 1316, 1318 and 1320 is mounted to a printed circuit board 1322, which is physically coupled to the busbar structure 1300. For example, the respective busbars 1304, 1306, and 1308 include through-hole connectors to electrically connect the busbar at one level with another portion of the busbar shown at 1324, 1326 and 1328. As described herein, respective sensors 1310, 1312, 1314, 1316, 1318 and 1320 are spatially located with respect to each of the busbars (and to each other) to reduce variations in magnetic coupling among the respective sensors and busbars.

Figure 14:
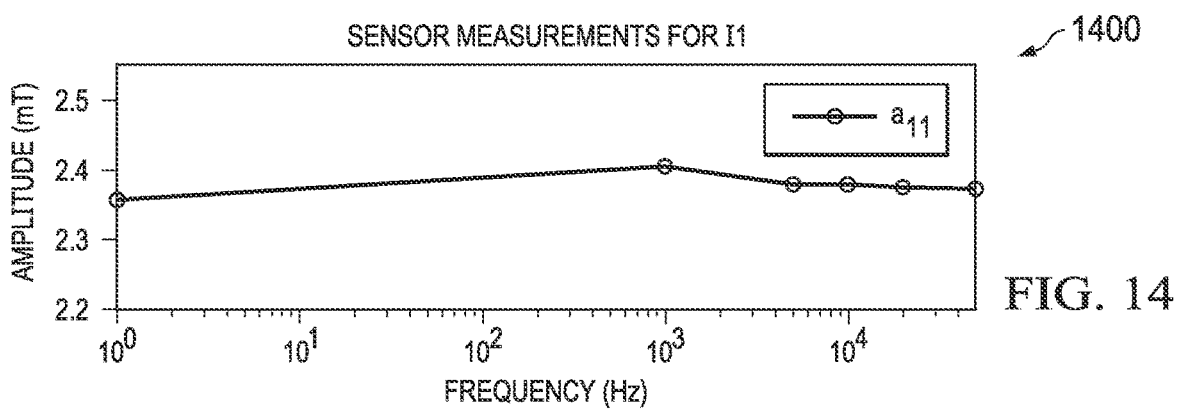
FIG. 14 is a plot of measured magnetic field amplitude as a function of frequency for a respective sensor in FIG. 13.
Figure 15:
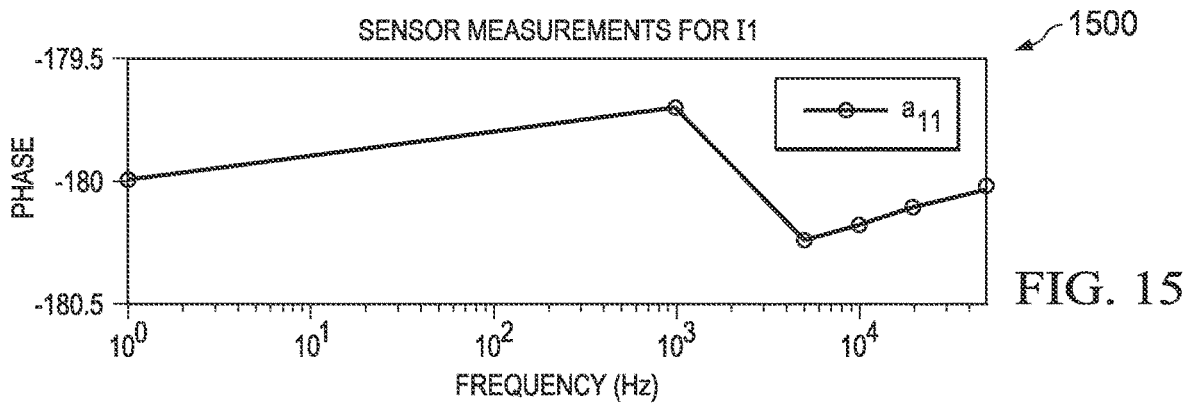
FIG. 15 is a plot of measured magnetic field phase as a function of frequency for a respective sensor in FIG. 13.

As another example, FIGS. 14 and 15 illustrate respective plots 1400 and 1500 for the magnetic field measurements of respective sensors 1310 and 1312 when electrical current is supplied to busbar 1304 only (e.g., no current is supplied to busbars 1306 and 1308). As shown in FIGS. 14 and 15 there is reduced variation across frequency for the sensor measurement provided by magnetic sensors 1310 and 1312 compared to the example of FIG. 8. In the example of FIG. 14, for a set of respective coupling coefficients, the amplitude variations across frequencies are less than 1.6% and the phase variations are less than 0.6 degrees. This can be compared with the example of FIG. 8, in which the amplitude variations are greater than 10% and there is about a 3 degree phase variation across frequencies.

As a further example, the magnetic field measurements for when current is supplied to busbar 1304 may be represented as follows:

$$\begin{bmatrix} \tilde{b}_1 + \tilde{b}_2 \\ \tilde{b}_3 + \tilde{b}_4 \\ \tilde{b}_5 + \tilde{b}_6 \end{bmatrix} = \begin{bmatrix} 2.41e^{j179.7°} & 0.12e^{-j0.6°} & 0.18e^{-j0.5°} \\ 0.06e^{-j15.9°} & 2.38e^{j179.9°} & 0.46e^{j1.9°} \\ 0.06e^{j0.6°} & 0.06e^{-j1.3°} & 2.07e^{j0.3°} \end{bmatrix} \begin{bmatrix} \tilde{I}_1 \\ \tilde{I}_2 \\ \tilde{I}_3 \end{bmatrix} \quad \text{Eq. 13}$$

where the coupling coefficients are complex values determined for the particular configuration shown in FIG. 13 (e.g., by computer simulation characterizing the busbar 1300 and current sensing system 1302), in which variations exist over the range of frequencies shown.

Figure 16:
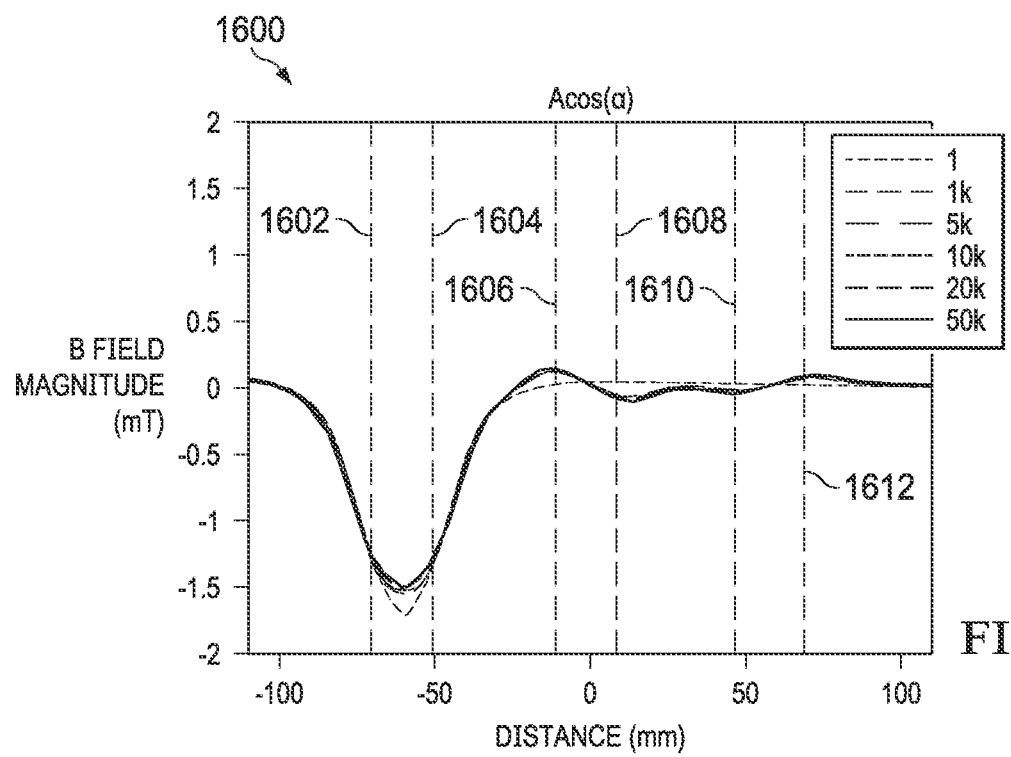
FIG. 16 is a graph of a real portion of magnetic field plotted as a function of location for a respective sensor in FIG. 13.
Figure 17:
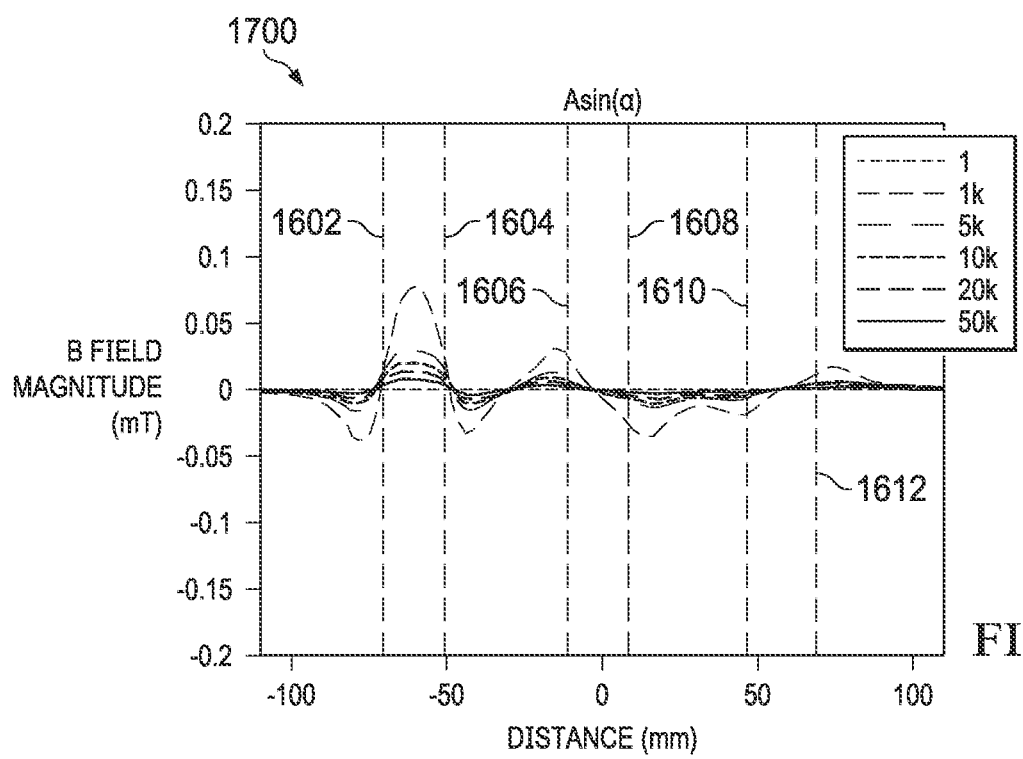
FIG. 17 is a graph of an imaginary portion of magnetic field plotted as a function of location for a respective sensor in FIG. 13 over a range of frequencies.

FIGS. 16 and 17 are plots 1600 and 1700 showing simulated magnetic fields for the busbar 1304 based on positions of sensors 1310, 1312, 1314, 1315, 1318 and 1320 in the example system 1302 shown in FIG. 13. For example, the dashed lines in FIGS. 16 and 17, shown as 1602, 1604, 1606, 1608, 1610 and 1612, are representative of locations of the respective sensors 1310, 1312, 1314, 1316, 1318 and 1320, and thus are the same in FIGS. 16 and 17. By positioning sensors at such locations the magnetic field measurements provided by the sensors in the sensor array 1302 further reduce variations across frequency due to magnetic coupling. The reduction occurs both respect to amplitude, as shown in plot 1600, as well as the phase values, as shown in plot 1700.

Additionally, as shown in FIGS. 16 and 17, the aggregate magnetic field measurements provided by respective sensors 1310 and 1312 for busbar 1304 at locations 1602 and 1604 are additive across frequencies (e.g., the respective magnetic field measurements reinforce one another). However, the aggregate magnetic field measurements at locations 1606 and 1608 as well as at 1610 and 1612 for the other sensors (e.g., sensors 1314, 1316, 1318, 1320), which magnetic fields are due to magnetic coupling responsive to the current through the busbar 1304, have less variations and/or cancel each other out. For example, the amplitude and phase measurements by respective sensors 1314 and 1316 (shown as location 1606 and 1608) exhibit reduced variation and/or cancel out in both the amplitude and phase plots 1600 and 1700. Because the frequency variations are significantly less when multiple sensors are applied to each of the respective busbars 1304, 1306 and 1308, the resulting phase and amplitude correction is simplified. For example, no frequency-based correction is needed. Instead, a static correction matrix is applied to perform amplitude correction, such as described herein. The reduced imaginary coupling coefficients shown in FIG. 17 at the respective sensing locations also shows better amplitude decoupling performance without requiring phase correction. This is because amplitude correction alone, as described above as shown in Eqs. 9 and 12, may not adequately address phase distortions in the coupling matrix. For example, Amplitude*exp (j phase)=Amplitude*cos(phase)+j Amplitude*sin(phase), such that the A sin(phase) term shown in FIG. 17 cannot be corrected by amplitude correction.

Figure 18:
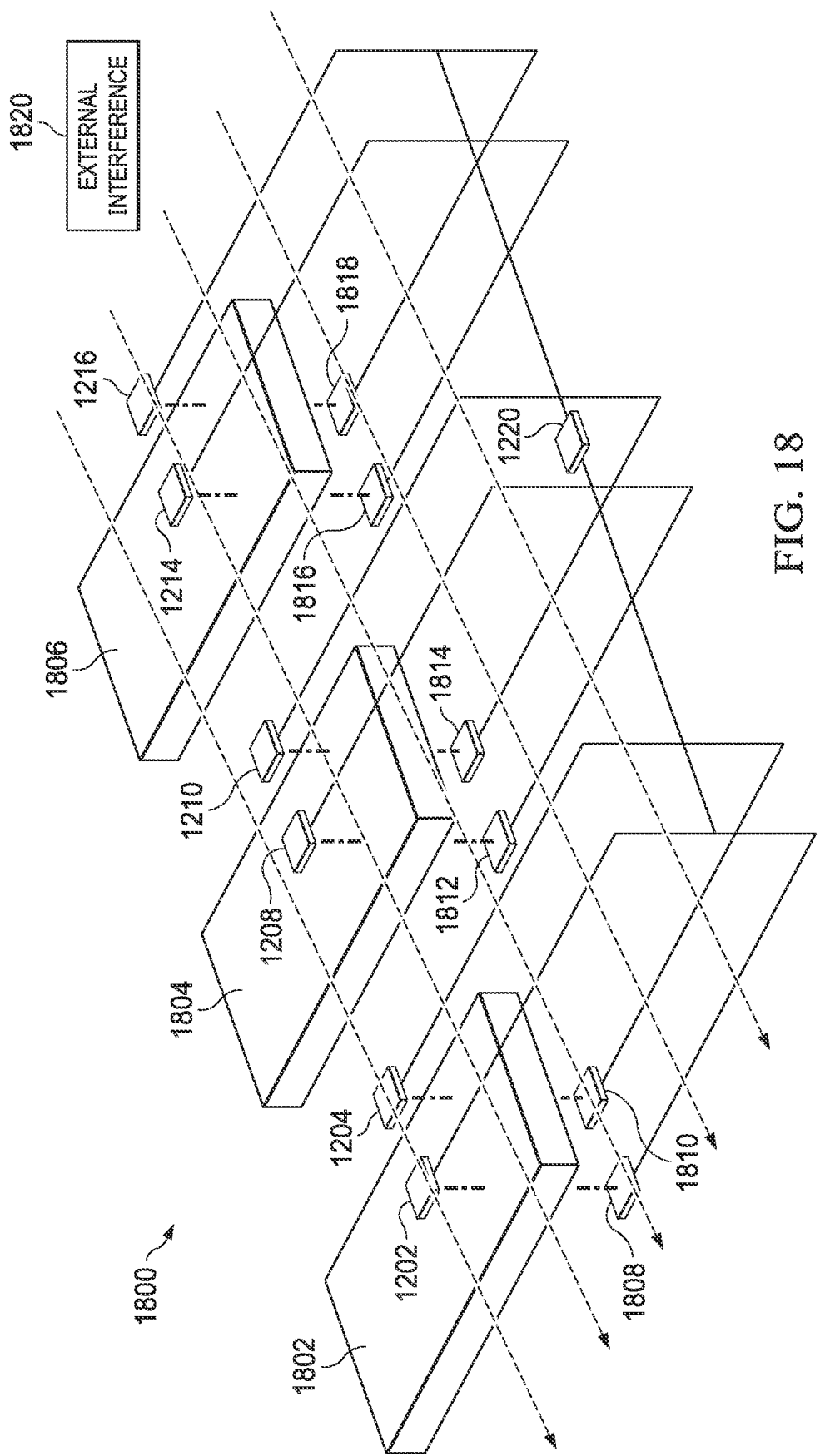
FIG. 18 is a diagram of another example multi-phase current sensing system configured to reduce external interference.

FIG. 18 depicts another example of a sensor array 1800, which can be implemented in a current sensing system configured to measure current for a multi-phase busbar structure. The example in FIG. 18 is similar to the sensor array 1200 in FIG. 12. Accordingly, the description of FIG. 18 also refers to FIG. 12. The sensor array 18 thus includes magnetic field sensors 1202, 1204, 1208, 1210, 1214 and 1216.

Additionally, the sensor array 1800 includes one or more additional magnetic field sensors 1808, 1810, 1812, 1814, 1816 and 1818 arranged and configured to measure magnetic field for each of the respective busbars 1802, 1804 and 1806. For example, the sensors 1808 and 1810 are arranged and configured to measure the magnetic field for busbar 1802. Magnetic field sensors 1812 and 1814 are arranged and configured to measure magnetic field of busbar 1804, and magnetic field sensors 1816 and 1818 are arranged and configured to measure magnetic field of busbar for 1806. In the example of FIG. 18, the additional sensors 1808, 1810, 1812, 1814, 1816 and 1818 are positioned on the opposite side of the busbar from sensors 1202, 1204, 1208, 1210, 1214 and 1216. The signals produced by sensors 1808, 1810, 1812, 1814, 1816 and 1818 thus can be correlated to measure and reject magnetic field interference coming from an external source, shown schematically at 1820. There can be any number of external sources of interference, and the measurements from the body respective sensors can be configured accordingly. When the direction of the interference is known, respective sensing axes of the magnetic field sensors can be positioned and configured to sense magnetic fields in respective different directions. Additionally, each of the magnetic field sensors can be coupled to combiner interface 1220. As described herein, the combiner interface 1220 is configured to combine the respective magnetic field signals. The combiner interface 1220 can also be configured to implement any external interference rejection as well as implement a coupling matrix configured to reduce variations in the sensed magnetic field due to magnetic coupling over frequency.

Figure 19:
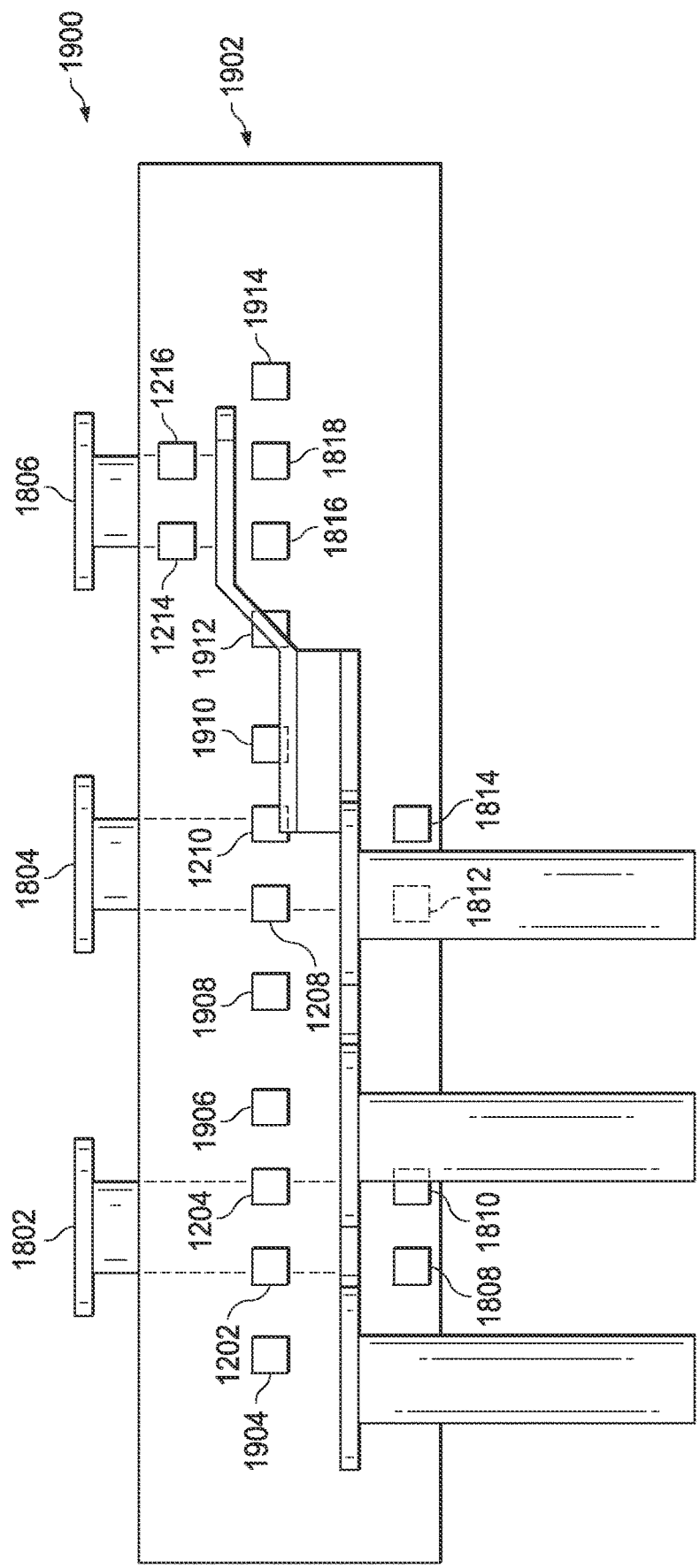
FIG. 19 is a perspective view of a magnetic current sensors coupled to a busbar and configured to reduce external interference.

FIG. 19 is a side view of an example busbar system 1900 that includes a current sensing system 1902 configured to measure busbar current. The example of FIG. 19 can be used to implement the sensor array 1800 shown in FIG. 18. Accordingly, the description of FIG. 19 also refers to FIG. 18. Thus, in addition to the respective sets of magnetic field sensor circuits 1202, 1204, 1208, 1210, 1214, 1216, 1808, 1810, 1812, 1814, 1816 and 1818, the sensing system 1902 also includes additional magnetic field sensors, shown at 1904 and 1906, 1908, 1910, 1912, and 1914. The additional sensors 1904-1914 have sensing axes that can be aligned along (e.g., parallel to) a direction that is different from the sensing axis of respective sensors 1202, 1204, 1208, 1210,

1214, 1216, 1808 1810, 1812, 1814, 1816 and 1818. In an example, respective sensors 1202, 1204, 1208, 1210, 1214, 1216, 1808 1810, 1812, 1814, 1816 and 1818 are configured to sense magnetic fields in a horizontal direction (e.g., a direction along a plane that is perpendicular the plane of the page on which the drawing resides), and the additional sensors 1904-1914 are configured to sense magnetic fields in a direction that is orthogonal to the horizontal direction (along the Z axis). The magnetic field measurements and respective sensor signals can be combined by combining circuitry (e.g., combiner interface 1220), such as described herein. The addition of the sensors 1904-1914 in the example system 1900 enables enhanced rejection of external interference.

Figure 20:
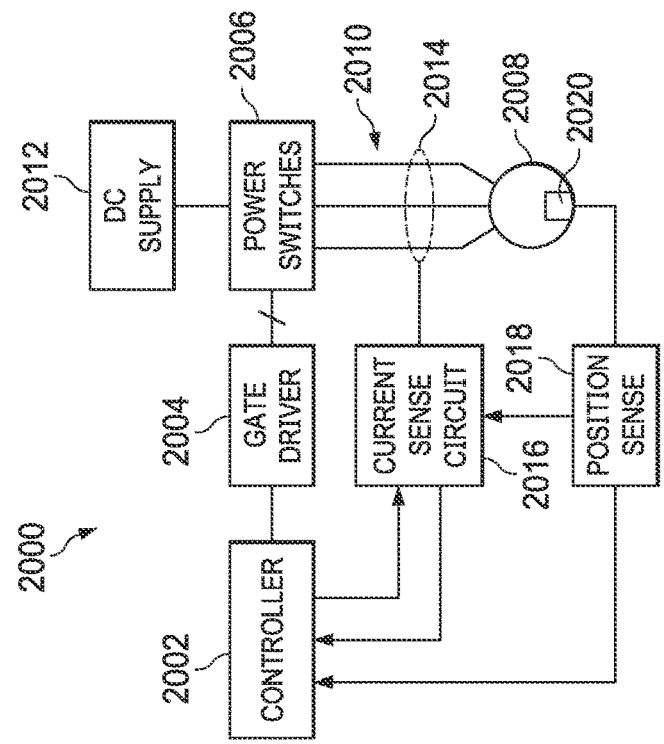
FIG. 20 is a block diagram of an example inverter system configured to implement magnetic current sensing.

FIG. 20 depicts an example of an electromotive system 2000 implementing a current sensing system as described herein. In an example of FIG. 20, the system 2000 includes a controller 2002 configured to control operation of the system. The controller 2002 has an output coupled to a driver circuit 2004. The controller 2002 is configured to provide control signals to the driver circuit 2004 responsive to a sensed current (e.g., provided by current sense circuit 2016). The driver has one or more outputs coupled to inputs of an arrangement of power switches 2006. The driver is configured to control the power switches 2006 responsive to the control signals (from controller 2002).

For example, the power switches 2006 include metal-oxide semiconductor field-effect transistors (MOSFETs), junction field-effect transistors (JFETs), bipolar junction transistors (BJTs), insulated gate bipolar transistors (IGBTS), high electron mobility transistors (HEMTs), or other types of power transistors depending on the use environment. In an example, the power switches can include high-side and low-side FETs configured as a half-bridge coupled to each phase of a multi-phase electric machine 2008 (e.g., a motor or generator). In an example, the driver 2004 is a gate driver having outputs coupled to respective gates of MOSFETs (e.g., the power switches 2006) and configured to provide pulses for controlling operation of the MOSFETs, which supply current to a respective phase of the electric machine 2008.

The power switches 2006 are coupled to the phases of the electric machine 2008 through a conductive structure 2010. In an example, the conductive structure 2010 is a multi-phase busbar that includes a respective busbar coupled to each phase of the electric machine 2008. For example, the busbar 2010 is a three-phase busbar. Different numbers of two or more phases can be used.

In an example, the power switches 2006 are configured to operate as an inverter responsive to the driver output signals for converting a direct current (DC) voltage from a power supply 2012 to an alternating current (AC) current that is supplied to the respective phases of the electric machine 2008 through the busbar structure 2010.

A field sensor array 2014 is coupled to the busbar structure 2010, as described herein. For example, the sensor array 2014 includes an arrangement of magnetic field sensors spatially arranged and configured to sense of the magnetic field for each busbar phase. As described herein, the sensed magnetic field is representative of current supplied to a respective phase of the electric machine 2008. The sensor array 2014 can be configured according to any of the structures described herein (see, e.g., FIGS. 1, 2, 6, 7, 12, 13, 18, 19). The current sense circuit 2016 is coupled to the controller and configured to provide the measure of current for each of the respective busbars to the controller. The current sense circuit 2016 is configured to combine the magnetic field measurements and convert the measured magnetic fields to respective current measurements. For example, the current sense circuit 2016 includes a combiner interface, such as combiner interface 122, 614, 1220, which is configured to combine magnetic field measurements provided by multiple magnetic field sensors. The combiner interface further can include a coupling matrix that is applied to determine a measure of current through the busbar structure 2010 responsive the magnetic field sensor signals from the sensor array 2014 and reduce variations due to cross-coupling of magnetic fields responsive to current flowing through the busbar. In some examples, the current sense circuit 2016 also includes correction circuitry, such as correction circuitry 130, 300, 312, 324, which is configured to correct for amplitude and/or phase variations across frequency.

Figure 21:
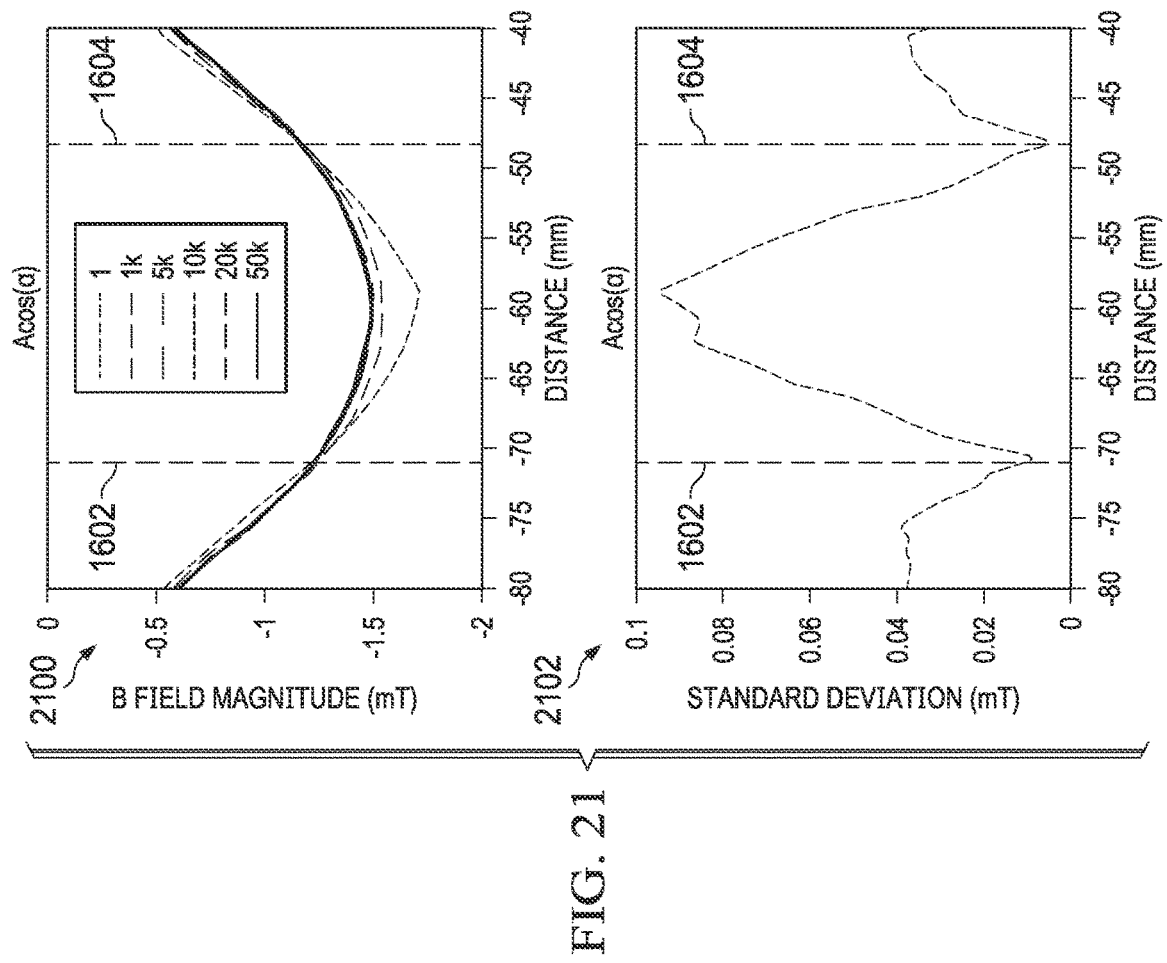
FIG. 21 are graphs for a real portion of magnetic field showing magnitudes and standard deviation plotted as a function of location for a respective sensor in FIG. 13 over a range of frequencies.

FIG. 21 are graphs 2100 and 2102 showing magnitudes and standard deviation for a real portion of magnetic field plotted as a function of location for a respective sensor in FIG. 13 over a range of frequencies. The graph 2100 shows an enlarged view of the graph 1600 of FIG. 16, in which the locations 1602 and 1602 for respective sensors 1310 and 1312 are shown. Accordingly, the description of FIG. 21 also refers to FIGS. 13 and 16. The graph 2102 shows the standard deviation of the plots in the graph 2100, which show the real parts (e.g., A cos($\alpha$)) of the coupling coefficients for frequencies ranging from 1 Hz to 50 kHz between distance coordinates (e.g., from −80 mm to −40 mm). The standard deviation of the real part of the coupling coefficients over frequency thus be used an objective function to determine optimal sensor locations (e.g., locations that lead to minimum variations in magnetic coupling over frequency) for a respective busbar, shown at 1602 and 1604. The spatial location of the respective sensors 1310 and 1312 thus can be arranged and configured with respect to a respective busbar 1304 responsive to the locations providing the smallest standard deviation over frequency.

Figure 22:
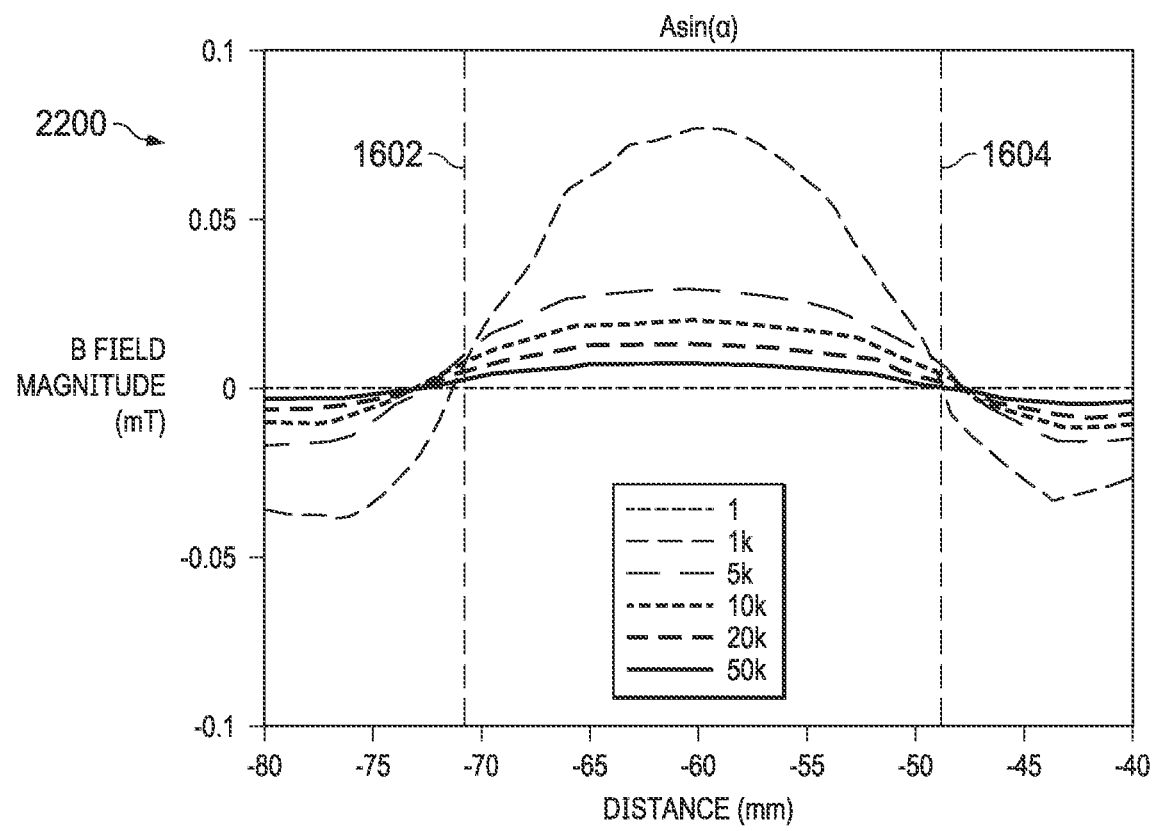
FIG. 22 are graphs of an imaginary portion of magnetic field showing magnitudes and standard deviation plotted as a function of location for a respective sensor in FIG. 13 over a range of frequencies.
Figure 22:
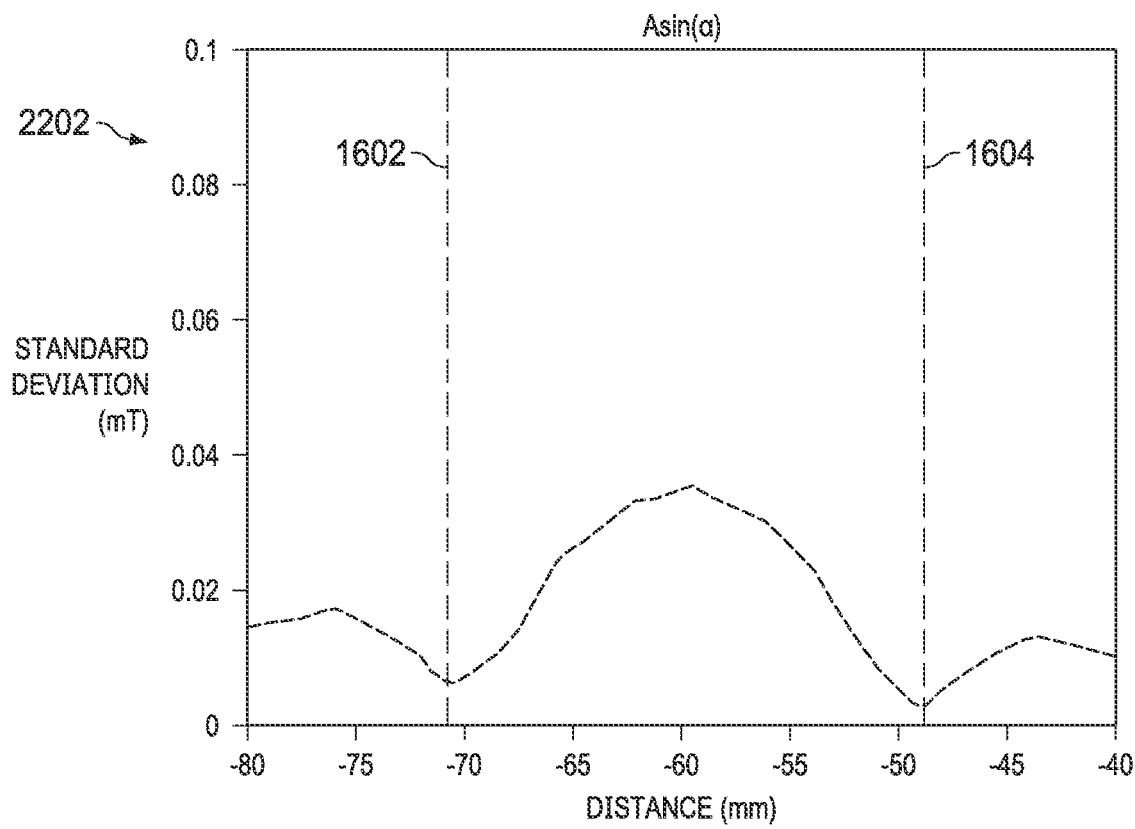

FIG. 22 are graphs 2200 and 2202 of an imaginary portion of magnetic field showing magnitudes and standard deviation plotted as a function of location for a respective sensor in FIG. 13 over a range of frequencies. The graph 2200 shows an enlarged view of the graph 1700 of FIG. 17, in which the locations 1602 and 1602 for respective sensors 1310 and 1312 are shown. Accordingly, the description of FIG. 22 also refers to FIGS. 13 and 17.

The graph 2202 shows the standard deviation of the plots in the graph 2200, which show the imaginary parts (e.g., A sin($\alpha$)) of the coupling coefficients for frequencies ranging from 1 Hz to 50 kHz between distance coordinates (e.g., from −80 mm to −40 mm). The standard deviation of the imaginary part of the coupling coefficients over frequency thus be used an objective function to determine optimal sensor locations (e.g., locations that lead to minimum variations in magnetic coupling over frequency) for a respective busbar, shown at 1602 and 1604. The spatial location of the respective sensors 1310 and 1312 thus can be arranged and configured with respect to a respective busbar 1304 responsive to the locations providing the smallest standard deviation over frequency.

In some examples, the locations can be determined objectively responsive to relative weighting of the two standard deviation curves (real and imaginary) 2102 and 2202 to determine sensor locations. In the example of FIGS. 21 and 22, the locations 1602 and 1604 are very close. In other examples, such as where there may be asymmetric busbar configurations, the smallest standard deviations might differ. In such an example, a cost function could be implemented to choose the sensor locations according to application requirements, such as to weigh either the reduction in amplitude variations or phase distortion more heavily.

Figure 23:
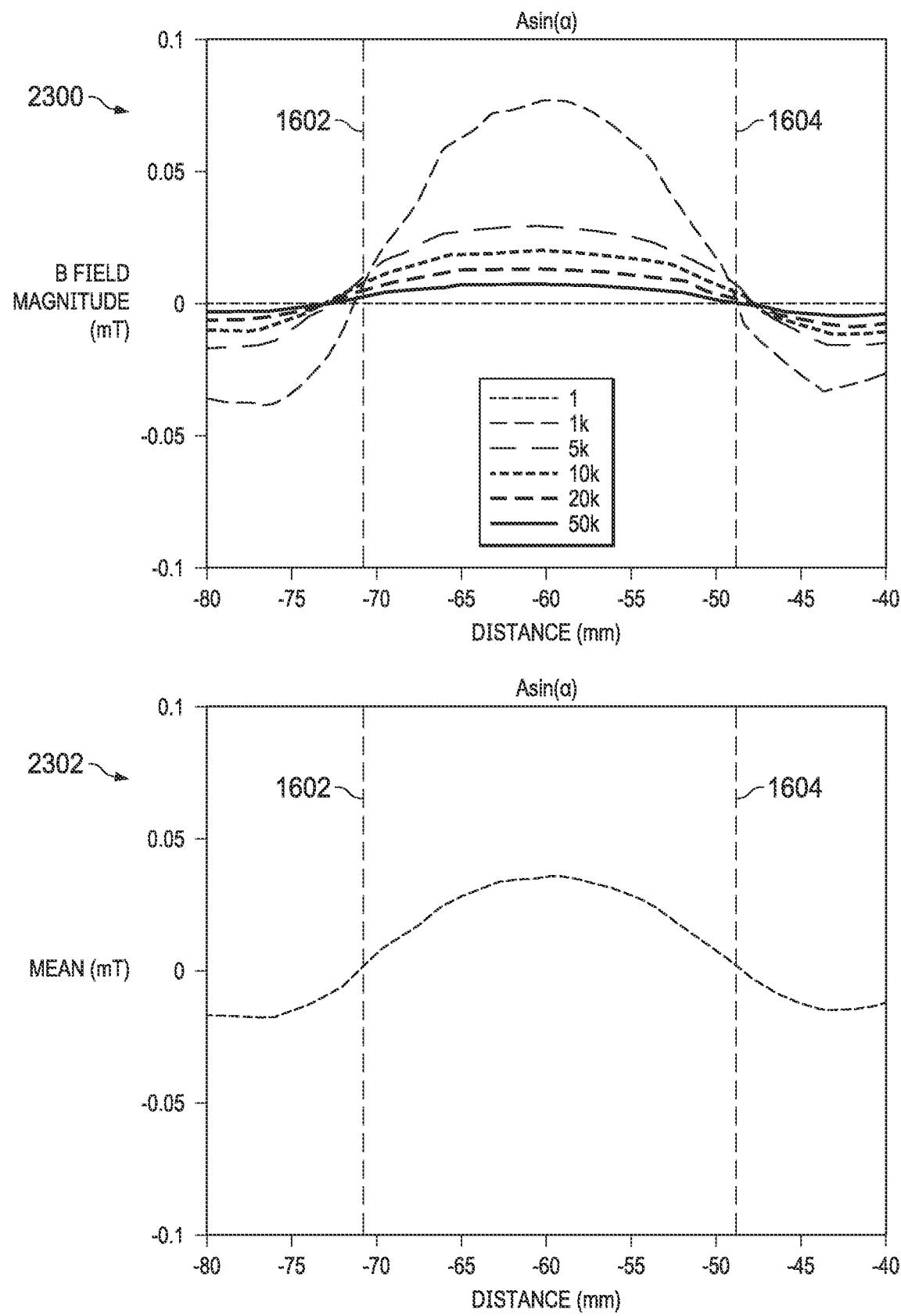
FIG. 23 are graphs of an imaginary portion of magnetic field showing magnitudes and the mean plotted as a function of location for a respective sensor in FIG. 13 over a range of frequencies.

FIG. 23 are graphs 2200 and 2302 of an imaginary portion of magnetic field (e.g., A sin(α)) showing magnitudes and a mean of the magnitudes of coupling coefficients plotted as a function of location for a respective sensor in FIG. 13 over a range of frequencies. The plot 2200 is the same as in FIG. 22. In the plot 2302, the locations 1602 and 1604 are determined as the locations that lead to minimum phase distortions over frequency (e.g., locations are selected where mean values over frequency are close to—or at—zero) for the imaginary part of the coupling coefficients. In some examples, relative weighting is assigned to the coupling coefficients at each frequency and then compute the mean to provide a relative weighting responsive to frequency of the current in an objective function. In another example, an objective function is determined based on relative weighting of the two standard deviation curves (e.g., real and imaginary plots 2102 and) and the mean value of the imaginary parts (e.g., plot 2302) to determine sensor locations. The real and imaginary parts of coupling coefficients can also be expressed as amplitude and phase parts. Similar optimization can be done based on amplitude and phase of the coupling coefficients. One or more of the approaches described above for busbar 1304 would be implemented to determine sensor locations for each of the other busbars in the sensing system.

In view of the foregoing, magnetic current sensing can be implemented so that amplitude and/or phase variations of sensed magnetic fields with respect to frequency can be reduced compared to existing approaches. Additionally, circuitry is described to combine sensor data in a way that can reduce computation requirements compared to existing approaches.

In this application, the term "couple" or "couples" means either an indirect or direct connection. Thus, if a first device couples to a second device, that connection may be through a direct connection or through an indirect connection via other devices and connections. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

The recitation "based on" means "based at least in part on." Therefore, if X is based on Y, X may be a function of Y and any number of other factors.

Modifications are possible in the described embodiments, and other embodiments are possible, within the scope of the claims.

What is claimed is:

1. A circuit comprising:
   a magnetic field sensor having a sensor output, the magnetic field sensor configured to provide a first sensor signal at the sensor output, in which the first sensor signal represents a first current signal through a first conductive structure; and
   a combiner circuit having first and second combiner inputs and a combiner output, the first combiner input coupled to the sensor output, and the combiner circuit configured to:
   receive a second sensor signal at the second combiner input, in which the second sensor signal represents a second current signal through a second conductive structure;
   responsive to the first and second sensor signals, provide a measurement signal representing the first or second current signals at the combiner output.

2. The circuit of claim 1, wherein the first conductive structure includes a first busbar, and the second conductive structure includes a second busbar.

3. The circuit of claim 1, wherein the magnetic field sensor is a first magnetic field sensor, the second sensor signal is received from a second magnetic field sensor, and the first and second magnetic field sensors include respective first and second Hall-effect sensors.

4. The circuit of claim 3, further comprising the second magnetic field sensor, and a circuit board on which the first and second magnetic field sensors are mounted.

5. The circuit of claim 1, wherein the combiner output is a first combiner output, the measurement signal is a first measurement signal, the combiner circuit has a second combiner output and includes an amplitude correction circuit having first and second amplitude correction inputs and first and second amplitude correction outputs, the first and second amplitude correction inputs coupled to the respective first and second combiner inputs, and the amplitude correction circuit configured to, responsive to the first and second sensor signals:
   provide a first amplitude signal at the first amplitude correction output representing a first amplitude of the first current signal; and
   provide a second amplitude signal at the second amplitude correction output representing a second amplitude of the second current signal.

6. The circuit of claim 5, wherein the first sensor signal represents a first frequency of the first current signal, the second sensor signal represents a second frequency of the second current signal, and the amplitude correction circuit is configured to provide the first and second amplitude signals responsive to the first and second frequencies.

7. The circuit of claim 5, wherein the combiner circuit includes a phase correction circuit having first and second phase correction inputs and first and second phase correction outputs, the first phase correction input coupled to the first amplitude correction output, the second phase correction input coupled to the second amplitude correction output, the first phase correction output coupled to the first combiner output, the second phase correction output coupled to the second combiner output, and the phase correction circuit configured to, responsive to the first and second amplitude signals:
   provide the first measurement signal representing the first amplitude and a first phase of the first current signal at the first phase correction output; and
   provide a second measurement signal representing the second amplitude and a second phase of the second current signal at the second phase correction output.

8. The circuit of claim 7, wherein the first sensor signal represents a first frequency of the first current signal, the second sensor signal represents a second frequency of the second current signal, and the phase correction circuit is configured to provide the first and second measurement signals responsive to the first and second frequencies.

9. The circuit of claim 1,
wherein the combiner circuit has third and fourth combiner inputs and configured to:
receive a third sensor signal at the third combiner input, in which the third sensor signal represents the first current signal through the first conductive structure;
receive a fourth sensor signal at the fourth combiner input, in which the fourth sensor signal represents the second current signal through the first conductive structure; and
provide the measurement signal responsive to the third and fourth sensor signals.

10. The circuit of claim 9, wherein the magnetic field sensor is a first magnetic field sensor, the second sensor signal is received from a second magnetic field sensor, the third sensor signal is received from a third magnetic field sensor, and the fourth sensor signal is received from a fourth magnetic field sensor; and
wherein the first and third magnetic field sensors are on opposite sides of the first conductive structure, and the second and fourth magnetic field sensors are on opposite sides of the second conductive structure.

11. The circuit of claim 10, wherein the first and third magnetic field sensors are on a same side of the first conductive structure, and the second and fourth magnetic field sensors are on a same side of the second conductive structure.

12. The circuit of claim 1,
wherein the magnetic field sensor is a first magnetic field sensor, the second sensor signal is received from a second magnetic field sensor, the combiner circuit has a third combiner input and the combiner circuit configured to:
receive a third sensor signal from a third magnetic sensor having a sensing axis different from the first and second magnetic field sensors; and
provide the measurement signal responsive to the third sensor signal.

13. The circuit of claim 1, wherein the first and second current signals have different phases.

14. The circuit of claim 1, wherein the first and second conductive structures are part of a multi-phase bus bar.

15. A circuit comprising:
a first magnetic field sensor having a first sensor output, the first magnetic field sensor proximate a first conductive structure and configured to provide a first sensor signal at the first sensor output;
a second magnetic field sensor having a second sensor output, the second magnetic field sensor proximate a second conductive structure and configured to provide a second sensor signal at the second sensor output; and
a combiner circuit having first and second combiner inputs and a combiner output, the first combiner input coupled to the first sensor output, the second combiner input coupled to the second sensor output, and the combiner circuit configured to, responsive to the first and second sensor signals, provide a measurement signal of a first current signal through the first conductive structure or a second current signal through the second conductive structure at the combiner output.

16. The circuit of claim 15, wherein the combiner output is a first combiner output, the measurement signal is a first measurement signal, and the combiner circuit includes an amplitude correction circuit having first and second amplitude correction inputs and first and second amplitude correction outputs, the first and second amplitude correction inputs coupled to the respective first and second combiner inputs, and amplitude correction circuit configured to, responsive to the first and second sensor signals:
provide a first amplitude signal at the first amplitude correction output representing a first amplitude of the first current signal; and
provide a second amplitude signal at the second amplitude correction output representing a second amplitude of the second current signal.

17. The circuit of claim 16, wherein the first sensor signal represents a first frequency of the first current signal, the second sensor signal represents a second frequency of the second current signal, and the amplitude correction circuit is configured to provide the first and second amplitude signals responsive to the first and second frequencies.

18. The circuit of claim 16, wherein the combiner circuit includes a phase correction circuit having first and second phase correction inputs and first and second phase correction outputs, the first phase correction input coupled to the first amplitude correction output, the second phase correction input coupled to the second amplitude correction output, and the phase correction circuit configured to, responsive to the first and second amplitude signals:
provide the first measurement signal representing the first amplitude and a first phase of the first current signal at the first phase correction output; and
provide a second measurement signal representing the second amplitude and a second phase of the second current signal at the second phase correction output.

19. The circuit of claim 18, wherein the first sensor signal represents a first frequency of the first current signal, the second sensor signal represents a second frequency of the second current signal, and the phase correction circuit is configured to provide the first and second measurement signals responsive to the first and second frequencies.

20. The circuit of claim 15, further comprising:
a third magnetic field sensor having a third sensor output, the third magnetic field sensor proximate the first conductive structure and configured to provide a third sensor signal at the third sensor output; and
a fourth magnetic field sensor having a fourth sensor output, the fourth magnetic field sensor proximate the second conductive structure and configured to provide a fourth sensor signal at the fourth sensor output,
wherein the combiner circuit has third and fourth combiner inputs, the third combiner input coupled to the third sensor output, the fourth combiner input coupled to the fourth sensor output, and the combiner circuit configured to provide the measurement signal responsive to the third and fourth sensor signals.

21. The circuit of claim 20, wherein the first and third magnetic field sensors are on opposite sides of the first conductive structure, and the second and fourth magnetic field sensors are on opposite sides of the second conductive structure.

22. The circuit of claim 15, wherein the first and second current signals have different phases.

23. The circuit of claim 15, wherein the first and second conductive structures are part of a multi-phase bus bar.

24. A system comprising:
switches coupled between a power input and first and second switch outputs, the switches also having switch control inputs;
a first conductive structure coupled between the first switch output and a first power output;
a second conductive structure coupled between the second switch output and a second power output;

a first magnetic field sensor having a first sensor output, the first magnetic field sensor proximate the first conductive structure and configured to provide a first sensor signal at the first sensor output;

a second magnetic field sensor having a second sensor output, the second magnetic field sensor proximate the second conductive structure and configured to provide a second sensor signal at the second sensor output;

a current sense circuit having first and second sensor inputs and first and second measurement outputs, the first sensor input coupled to the first sensor output, the second sensor input coupled to the second sensor output, and the current sense circuit configured to, responsive to the first and second sensor signals:

provide a first measurement signal of a first current signal through the first conductive structure at the first measurement output; and provide a second measurement signal of a second current signal through the second conductive structure at the second measurement output; and a controller having first and second control inputs and control outputs, the first control input coupled to the first measurement output, the second control input coupled to the second measurement output, and the control outputs coupled to the switch control inputs.

25. The system of claim 24, wherein the first measurement signal represents a first amplitude and a first phase of the first current signal, and the second measurement signal represents a second amplitude and a second phase of the second current signal.

26. The system of claim 24, wherein the current sense circuit includes:

an amplitude correction circuit having first and second amplitude correction inputs and first and second amplitude correction outputs, the first and second amplitude correction inputs coupled to the respective first and second sensor inputs, and the amplitude correction circuit configured to, responsive to the first and second sensor signals:

provide a first amplitude signal at the first amplitude correction output representing a first amplitude of the first current signal; and provide a second amplitude signal at the second amplitude correction output representing a second amplitude of the second current signal; and a phase correction circuit having first and second phase correction inputs and first and second phase correction outputs, the first phase correction input coupled to the first amplitude correction output, the second phase correction input coupled to the second amplitude correction output, the first phase correction output coupled to the first measurement output, the second phase correction output coupled to the second measurement output, and the phase correction circuit configured to, responsive to the first and second amplitude signals:

provide the first measurement signal representing the first amplitude and a first phase of the first current signal at the first phase correction output; and provide the second measurement signal representing the second amplitude and a second phase of the second current signal at the second phase correction output.

27. The system of claim 24, wherein the first and second current signals have different phases.

28. The system of claim 24, wherein the first and second conductive structures are part of a multi-phase bus bar.

* * * * *